US006442514B1

(12) United States Patent
Le

(10) Patent No.: US 6,442,514 B1
(45) Date of Patent: Aug. 27, 2002

(54) METHOD AND SYSTEM FOR SIMULATING A COMMUNICATIONS BUS

(75) Inventor: Tony Viet Nam Le, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/205,328

(22) Filed: Dec. 4, 1998

(51) Int. Cl.[7] .............................. G06F 9/44; G06F 9/45
(52) U.S. Cl. ............................ 703/21; 703/13; 703/20; 703/22; 710/311; 710/113; 710/100; 710/306
(58) Field of Search .......................... 703/13, 14, 17, 703/19, 21, 20, 22; 714/33, 34, 37, 38, 43; 710/113, 100, 129, 128, 311, 306; 750/121

(56) References Cited

U.S. PATENT DOCUMENTS

| | | | | |
|---|---|---|---|---|
| 5,715,433 A | * | 2/1998 | Raghavan et al. | 703/21 |
| 5,768,567 A | * | 6/1998 | Klein et al. | 703/13 |
| 5,857,091 A | * | 1/1999 | Fernandes et al. | 703/21 |
| 5,870,570 A | * | 2/1999 | Chambers et al. | 710/113 |
| 5,870,585 A | * | 2/1999 | Stapleton | 703/15 |
| 5,881,270 A | * | 3/1999 | Worthington et al. | 703/21 |
| 5,913,043 A | * | 6/1999 | Carter et al. | 710/100 |
| 5,923,867 A | * | 7/1999 | Hand | 703/14 |
| 5,930,482 A | * | 7/1999 | Carter et al. | 710/100 |
| 5,941,971 A | * | 8/1999 | Carter | 710/129 |
| 5,958,035 A | * | 9/1999 | Carter et al. | 703/17 |
| 5,966,306 A | * | 10/1999 | Nodine et al. | 700/121 |
| 5,996,034 A | * | 11/1999 | Carter | 710/100 |
| 6,108,738 A | * | 8/2000 | Chambers et al. | 710/113 |
| 6,123,735 A | * | 9/2000 | Raghavan et al. | 703/21 |

OTHER PUBLICATIONS

PCI Local Bus, "PCI Local Bus Specification" Product Version 2.1, published by PCI Special Interest Group, Jun. 1, 1995, pp. 8–117.

* cited by examiner

*Primary Examiner*—Kevin J. Teska
*Assistant Examiner*—W Thomson
(74) *Attorney, Agent, or Firm*—LeRoy D. Maunu, Esq.; Edel M. Young

(57) ABSTRACT

A method and system for simulation of a communications bus. A simulation arrangement is configured with a behavioral agent and an application agent coupled to the bus. Bus commands are selectively loaded in the behavioral and application agent in accordance with a desired simulation sequence. The behavioral agent is configurable with phase behavior instructions that specify assertion and deassertion times for selected signals by the behavioral agent. Compliant and non-compliant bus behavior can be simulated with the phase behavior instructions.

19 Claims, 15 Drawing Sheets

Memory Write Transaction, Phase Profile 4-2-1-2

Memory Write Transaction with Additional Wait States

Behavioral Target Responding to Memory Read

Example 64-bit Memory Write

METHOD AND SYSTEM FOR SIMULATING A COMMUNICATIONS BUS

RELATED PATENT APPLICATION

This patent application is related to U.S. patent application Ser. No. 09/205829 entitled "METHOD AND SYSTEM FOR DEMONSTRATING SIMULATION OF A COMMUNICATIONS BUS" by Tony Viet Nam Le, filed Dec. 4, 1998 and assigned to the assignee of the present invention, the contents of which are incorporated herein by reference.

COPYRIGHT NOTICE

The patent document includes an appendix, comprising the first three chapters of, "XILINX PCI Testbench User's Guide," the contents of which is incorporated by reference into the Detailed Description. The appendix contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention generally relates to simulation of electronic systems, and more particularly to simulating operation of a communication bus.

BACKGROUND

Many bus architectures are complicated, and therefore require an advanced simulation environment for testing. Once a design for a system is complete, it is desirable to identify and fix problems by simulating operation of the system before building the actual system. Example simulation tools include Verilog-XL from Cadence and ModelSim from Model Technology.

In addition to a simulation tool, a suitable test bench must be created which is functional with both the system design and with the simulation tool. For some popular bus architectures for which bus core logic is commercially available, a number of vendors provide test benches. The commercially available test benches relieve the user from having to recreate what others have already created.

Simulation scenarios seek to demonstrate compliance with the bus protocol. In addition, some scenarios are constructed to inject behaviors that are not compliant with the bus protocol in order to test a device's ability to appropriately respond to such error conditions.

Constructing and running various simulation scenarios can be very time consuming, and therefore expensive. For example, complicated sequences of signals must be selectively driven onto the bus at selected times. Furthermore, replication of test scenarios for following generations of devices may involve considerable test bench redesign. Therefore, a system and method that addresses the above identified problems would be desirable.

SUMMARY OF THE INVENTION

The present invention provides a method for simulating a communications bus. In one embodiment, the method has the following steps:

(a) instantiating a plurality of bus agents coupled to the bus, wherein the bus agents include a behavioral agent and an application agent;

(b) loading a first bus command into memory space of a selected one of the bus agents, the first bus command indicating a bus operation to be performed involving one or more data phases;

(c) loading phase behavior instructions into memory space of the behavioral agent, at least one of the phase behavior instructions specifying a data phase duration relative to the first bus command;

(d) processing the first command; and (e) conforming the data phases of the first bus command to the phase behavior instructions.

In another embodiment, the method comprises:

(a) instantiating a behavioral agent and an application agent coupled to the bus;

(b) loading master phase behavior instructions into memory space of the behavioral agent, the master phase behavior instructions including a starting address instruction, an address phase instruction, and one or more data phase instructions. The starting address instruction indicates an address at which to begin the bus transaction, the address phase instruction indicates the bus operation to be performed, and the data phase instructions specify selected signal sequences of the behavioral agent during the respective data phases;

(c) processing the bus command by the behavioral agent; and (d) conforming the data phases of the behavioral agent to the phase behavior instructions.

In still another embodiment, the method comprises:

(a) instantiating and coupling to the bus a behavioral agent and an application agent;

(b) loading target phase behavior instructions into memory space of the behavioral agent, the target phase behavior instructions including one or more data phase instructions. The data phase instructions specify selected signal sequences of the behavioral agent during the respective data phases;

(c) loading a bus command into memory space of the application agent, and (d) processing the bus command by the application agent. During processing of the bus command, the data phases of the behavioral agent are conformed to the phase behavior instructions.

According to another aspect of the invention, an arrangement for simulating operation of an electronic system including a communications bus is provided. The arrangement comprises a simulator, a bus, a behavioral agent, an application agent, a simulation control bus, and a simulation controller. The behavioral and application agents are coupled to the bus and hosted by the simulator. The simulation control bus is also coupled to the behavioral and application agents and is hosted by the simulator. The simulation controller is coupled to the simulation control bus and is hosted by the simulator, wherein the simulation controller is configured and arranged to selectively provide bus commands to the behavioral agent and to the application agent. Each bus command indicates a bus operation to be performed and involves one or more data phases, and selectively provides phase behavior instructions to the behavioral agent. The phase behavior instructions respectively specify data phase durations relative to the bus commands.

In another embodiment, the apparatus comprises:

(a) means for configuring a master agent with a bus command, the bus command indicating a bus operation to be performed involving one or more data phases;

(b) means for configuring a behavioral agent with one or more phase behavior instructions, at least one of the phase behavior instructions specifying a data phase duration relative to the first bus command;

(c) means for initiating processing of the bus command by the master agent; and (d) means for selectively driving selected bus signals in response to parameters in the phase behavior instructions.

The above summary of the present invention is not intended to describe each disclosed embodiment of the present invention. The figures and detailed description that follow provide additional example embodiments and aspects of the present invention. The attached appendix also provides additional information. The term "phase behavior command" used in the appendix is equivalent to the term "phase behavior instruction" used herein. For clarity, the term "instruction" used herein was chosen to more clearly distinguish from the terms "bus command" and "simulation command".

BRIEF DESCRIPTION OF THE DRAWINGS

The present invention is illustrated by way of example, and not by way of limitation, in the following figures, in which like reference numerals refer to similar elements.

Figure 1:
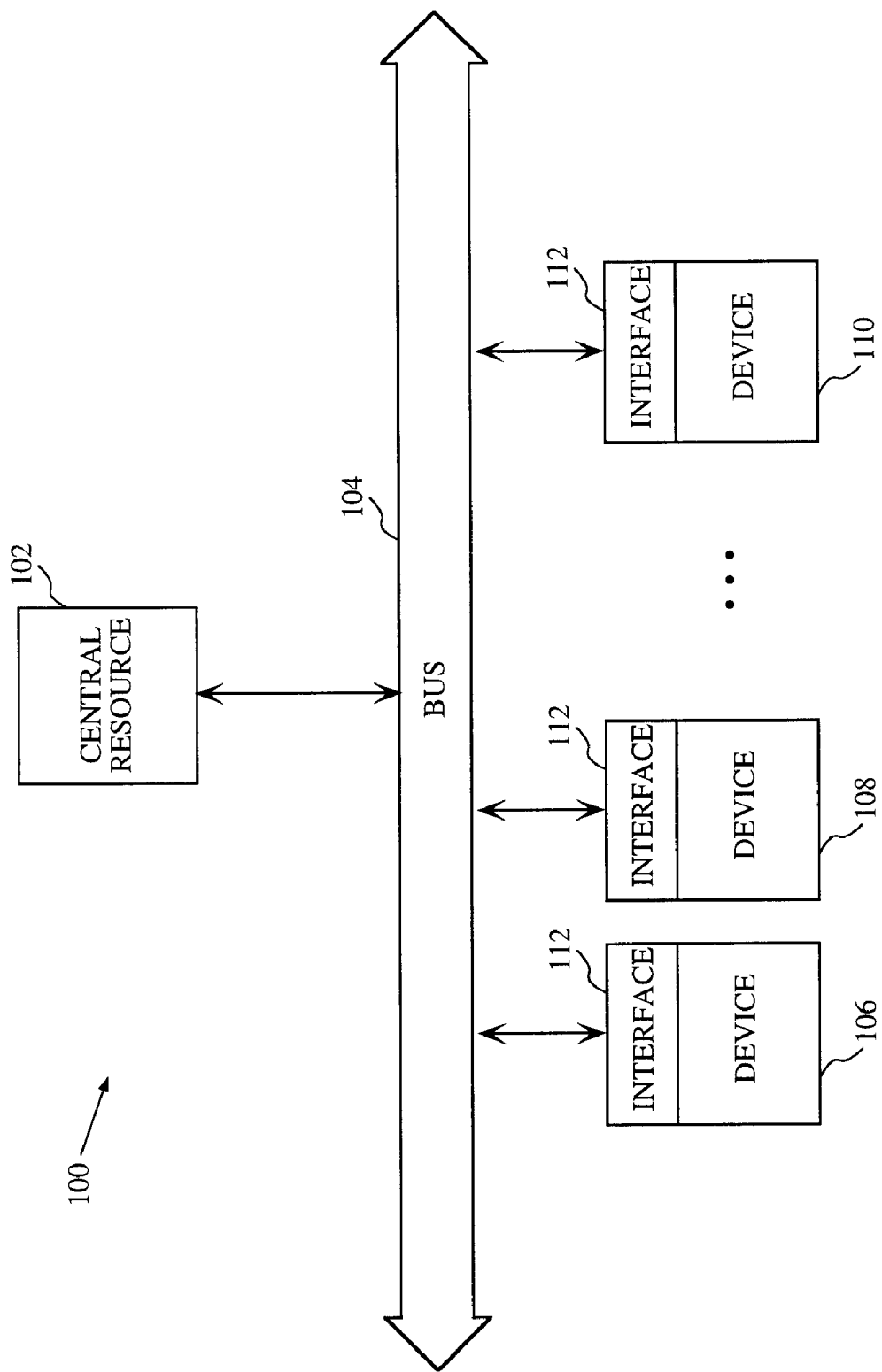
FIG. 1 is a functional block diagram of an example electronic system for which simulation may be desired.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intent is to cover all modifications, equivalents, and alternatives falling within the spirit and scope of the invention as defined by the appended claims.

DETAILED DESCRIPTION

The present invention is believed to be applicable to a variety of electronic systems that include application specific integrated circuits (ASICs), microprocessors, field programmable gate arrays (FPGAs) and other programmable logic. The invention has been found to be particularly beneficial in simulating bus logic cores for FPGAs. While the present invention is not so limited, an appreciation of the present invention is presented by way of a particular example application, in this instance, simulating an electronic system that includes bus core logic and multiple devices or "agents" coupled to the bus.

FIG. 1 is a functional block diagram of an example electronic system 100 for which simulation may be desired. The example system 100 includes a central resource 102, a bus 104, and example devices 106, 108, and 110. Each of the devices 106–110 includes respective interface logic 112, 114, and 116. Bus 104 is used for transmission of addresses and data and includes an assortment of control lines.

In an example system, the central resource 102 comprises a component with which one or more of the devices 106 communicates. For example, resource 102 may be a memory from and to which the devices can read and write data via the bus 104. Alternatively, the resource may be a host processor which interfaces directly with the devices 106–110. The devices 106–110 may include network interfaces, SCSI interfaces and other example input/output channels.

Simulation may be desired for all or part of the system 100. For example, a vendor of bus core logic for bus 104 may desire to simulate a system that includes resource 102, bus 104, and an arbitrary device 106. In this description the term "user" will be used to reference the one who is running the simulation of a system.

Bus 104 may be compliant with a particular standard, or may be an application specific bus. In either case, bus logic is used to implement the bus, wherein the bus logic includes interface logic 112 and logic that controls access to bus 104. When a user purchases logic that implements a particular bus architecture, the logic is often referred to as "bus core logic." The user that obtains bus core logic may also obtain a test bench that can be tailored to test the user's system.

The following figures illustrate an example system and method for simulating bus core logic. Generally, the process involves establishing desired agents that interface with bus 104. In an example scenario, one of the agents may be an agent that was designed by the user and whose behavior the user desires to simulate. The user-designed agent may also be referred to as an "application agent" or a "device-under-test" (DUT). A bus command is loaded into a data space of a selected one of the agents (the "master" agent), and phase behavior instructions are loaded into the data spaces of the master agent and into the data space of another selected one of the agents (the "target" agent). The particular bus command and phase behavior instructions are selected in accordance with a desired test scenario. The scenario typically involves using the application agent as either the master agent or the target agent. The phase behavior instructions dictate phase-by-phase behavior of the master and target while the bus command is in process. In the example embodiments set forth herein, processing of the bus command is often referred to as a "transaction."

A specific example embodiment of the invention described herein is a four-slot PCI system. The PCI bus signaling protocol is described in Chapters 2 and 3 of the "PCI Local Bus Specification," Revision 2.1, which is herein incorporated by reference. Various naming conventions of the PCI specification will be used in this specification without further explanation. It will be appreciated that the invention is not limited to PCI-based systems, and that the system described herein could be extended to support more than four agents coupled to a PCI bus.

Figure 2:
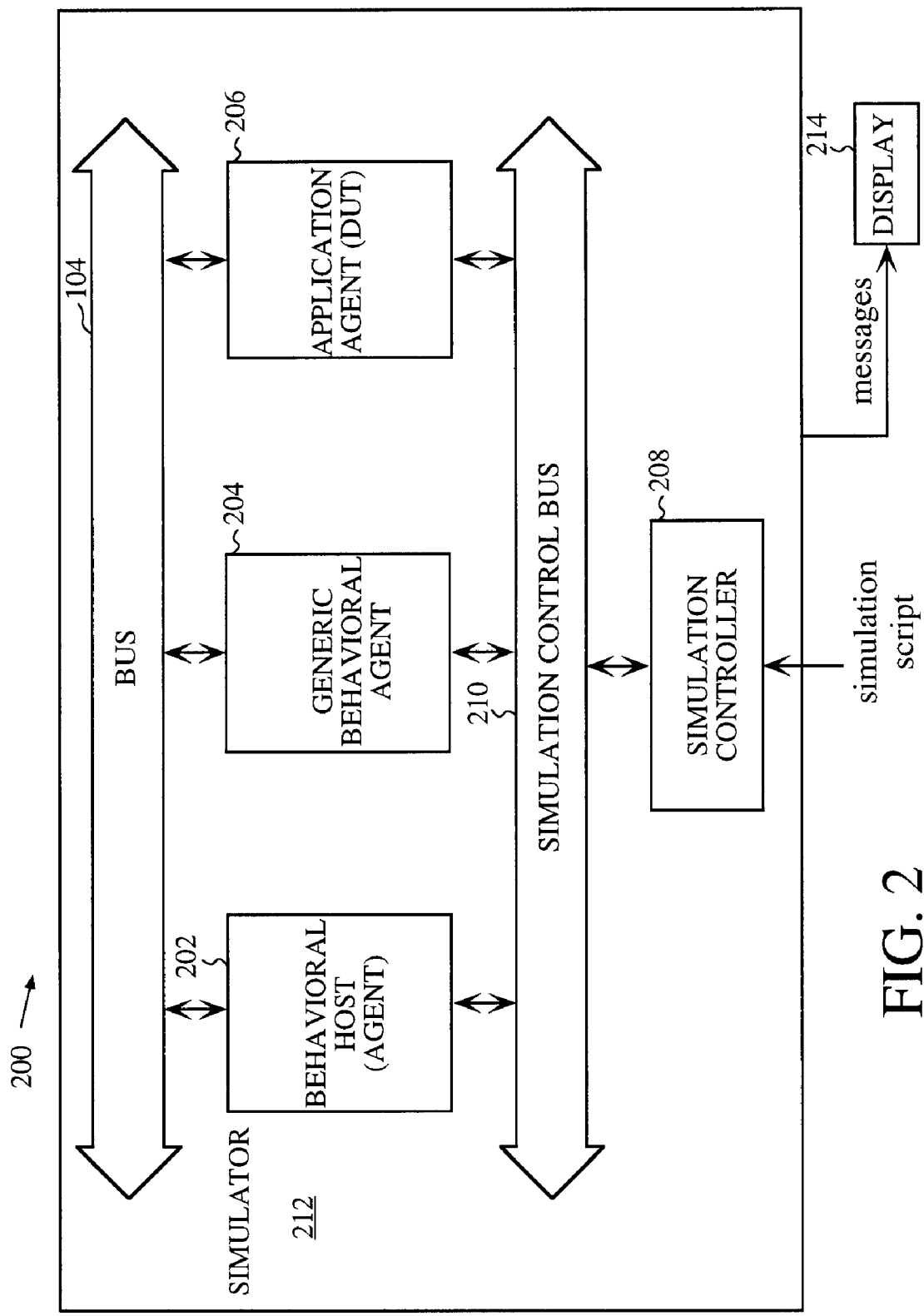
FIG. 2 is a block diagram of an example system in which operation of a bus and bus agents is simulated.

FIG. 2 is a block diagram of an example system 200 in which operation of a bus 104 and bus agents 202, 204, and 206 is simulated. The system 200 includes a bus 104 to which to example agents 202, 204, and 206 are coupled. Bus 104 may also be referred to herein as the core logic bus. Simulation of the system is controlled by simulation controller 208 which communicates with agents 202–206 via simulation control bus 210. Buses 104 and 210, along with agents 202–206 and simulation controller 208 are comprised of logic that is interpreted and whose functions are simulated by simulator 212. Simulator 212 is software such as Verilog-XL or ModelSim that is executable on a workstation, PC-compatible, or other processor-based computer. The simulation provides output messages to an example computer display 214.

Simulation controller 208 receives simulation commands from a simulation script as shown by line 212. These simulation commands are interpreted by simulation controller 208, and the specified functions are performed. Simulation commands in the simulation script are translated into signals that are sent from simulation controller 208 to agents 202–206 and to the bus core logic via simulation control bus 210. For example, a write-memory simulation command may address one of agents 202–206 from simulation control bus 210 and store data in the control memory (not shown) of the addressed agent. Generally, simulation controller 208 can address reserved data spaces in each of the agents. The special data spaces indicate to the agents the functions they are to perform on the core logic bus 104.

Simulation controller 208 also receives data from agents 202–206. For example, if simulation controller 208 sends a transaction calling for a data transfer from a master agent 202 to a target agent 206, the master and target agents interact to effect the data transfer via bus 104. The data is written to a buffer (not shown) of the bus core logic for target agent 206. The buffer is addressable by simulation controller 208 over simulation control bus 210. Simulation controller 208 can read the data from the buffer to verify proper operation of the core in processing the transaction.

The simulation controller performs several primitive-level tasks over simulation control bus 210, including read, write, and compare operations. Higher level tasks, such as block fills, copies, and comparisons between different test-object memories are built from these primitive tasks. Simulation control bus 210 operates at a frequency that is a multiple of the frequency of bus 104, allowing a large number of these tasks to execute in a single cycle of bus 104. This permits simulation controller 208 to set up multiple events during each cycle of bus 104.

Two of the primitive simulation commands for communicating over simulation control bus 210 include WRITE_MEM and READ_MEM for writing to and reading from the data spaces of agents 202–206. From these primitive simulation commands more complicated simulation commands are provided that simplify the process of setting up the phase behavior for a transaction.

The three example agents simulated in system 200 include a behavioral host agent 202, a generic behavioral agent 204, and an application agent 206. Application agent 206 is, for example, a user designed device that includes bus core logic for interfacing with bus 104. Application agent 206 is also referred to as the "device under test" (DUT). Behavioral host agent 202 and generic behavioral agent 204 are provided to participate in transactions with application agent 206 during the simulation.

In an example embodiment, generic behavioral agent 204 is a module that simulates any PCI compliant protocol of a 32-bit or 64-bit PCI agent. The agent can send and respond to memory and I/O transactions, as well as process 64-bit transfer requests. Also included are a configuration address space from which behavioral host agent 202 can read data.

Generic behavioral agent 204 accepts phase behavior instructions from simulation controller 208 that specify how the agent is to behave during each phase of a data transaction. For example, each instruction specifies the number of wait states to insert before asserting IRDY# or TRDY#, when to actively verify correct parity, when AD should be driven, and whether to generate correct parity. This allows the generic behavioral agent to demonstrate any PCI-compliant behavior. In addition, the flexibility of the phase behavior instructions allows the user to simulate various scenarios of non-compliant behavior in order to test the behavior of application agent 206.

Behavioral host 202 is an extension of generic behavioral agent 204. That is, host agent 202 includes all the features of generic agent 204 and also includes the additional capabilities of: issuing configuration commands to agents 204 and 206, tracking the configuration of agents 204 and 206 in the associated configuration space, arbitrating access to bus 104 between agents 202–206, and controlling the bus 104 reset signal.

Application agent 206 includes the user's application logic, the bus core logic, and wrapper logic that interfaces with simulation controller 208 via simulation control bus 210. An objective of the wrapper logic is to map control, status, and data from applications agent 206 into space that is addressable by simulation controller 208.

The modular architecture of the example embodiment described herein permits a user to easily instantiate in system 200 an application agent 206 that includes core logic for bus 104. Thus, the embodiments described herein are useful to suppliers of the bus core logic for verification of compliance with the bus protocol. The embodiments are also useful to the designers of devices configured to be coupled to bus 104.

Figure 3:
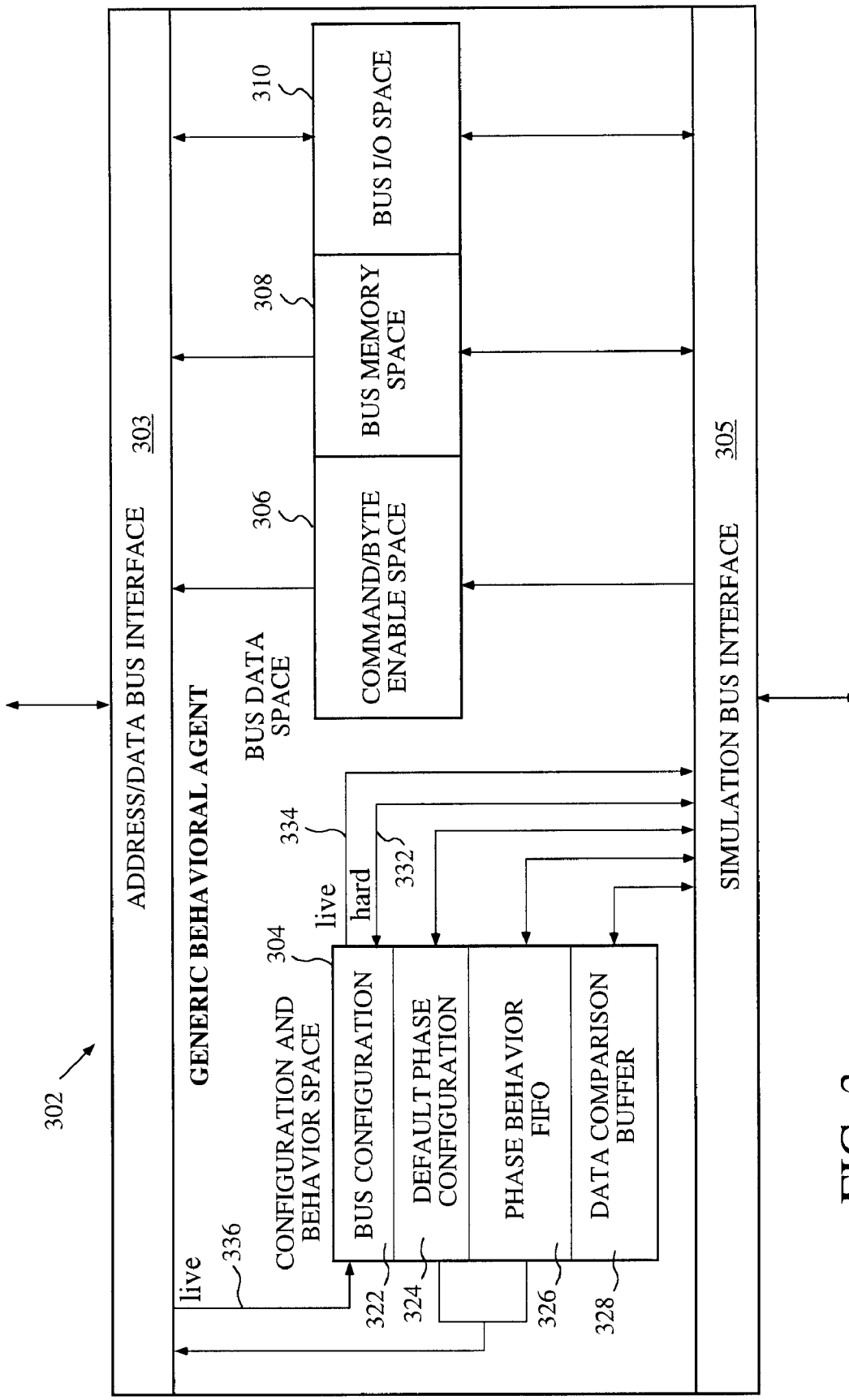
FIG. 3 is a block diagram of a generic behavioral agent according to an example embodiment of the invention.

FIG. 3 is a block diagram of a generic behavioral agent 302 according to an example embodiment of the invention. The directional lines in FIG. 3 represent the direction of data flow. Bus interface 303 provides an interface between bus 104 and address spaces 304, 306, 308, and 310. Simulation bus interface 305 interfaces with simulation control bus 210. Behavioral agent 302 maintains four main address spaces, including configuration and behavior space 304, command/byte-enable space 306, bus memory space 308, and bus I/O space 310. Address spaces 304, 306, 308, and 310 are interleaved, and simulation controller 208 addresses each of the data spaces using the lower two address bits.

Configuration and behavior space 304 is generally comprised of bus configuration space 322, default phase configuration space 324, phase behavior FIFO space 326, and a data comparison buffer space 328. Configuration space 304 includes "hard" configuration data and "live" configuration data. The hard configuration data represents the state of generic agent 302 as seen by bus 104 upon "power-up" of the system or reset of the bus. This information is loaded into the live configuration space at power-up or reset. Because the hard configuration data is readable and writable by simulation controller 208, as indicated by line 332, the hard configuration space can be loaded with different sets of values during a single simulation run to simulate different agents without recompiling and reloading a new agent.

The live configuration information is that which host agent 202 would receive if a read configuration command were issued. As shown by line 334, the live configuration data can only be read by simulation controller 208, whereas host agent 202 can modify the live configuration data, as shown by line 336.

The default phase configuration 324 and phase behavior FIFO 326 include phase behavior instructions that indicate how agent 302 should behave during respective transaction phases. The default phase behavior information is used if a phase behavior instruction is not available in phase behavior FIFO 326. As indicated by the data flow lines, both of spaces 324 and 326 can be read by host agent 202 and read and written by simulation controller 208.

In an example PCI simulation system, each phase behavior instruction in FIFO 326 indicates when during a data phase the agent's IRDY# or TRDY# signal is to be asserted, when DEVSEL# or FRAME# is to be deasserted and other behaviors that are described later in this document.

While not shown, configuration and behavior space 304 also includes an initiation flag and an interrupt vector, as well as other information. The initiation flag controls whether the agent, as a master, should initiate a transaction. This allows the simulation controller to prevent the agent from starting a transaction until the controller has written a series of phase behavior instructions that describe the transaction in full. This series of phase behavior instructions is referred to as a "transaction stream."

Data comparison buffer 328 allows the simulation controller to store a sequence of data for later comparison. This space can be used to store data that is expected to be transferred during a transaction. After the transaction is complete, the expected data is compared with the transferred data to determine whether the agents behaved as expected.

Command/byte-enable space 306 is used only for agents that have been enabled as masters in the example PCI bus implementation. The C/BE# signals that are to be driven onto bus 104 for each address represented by a data phase are stored in space 306.

Bus memory space 308 and bus I/O space 310 emulate, for example, the PCI memory and I/O address spaces. These spaces are used as data buffers for both transmitted and received data.

Figure 4:
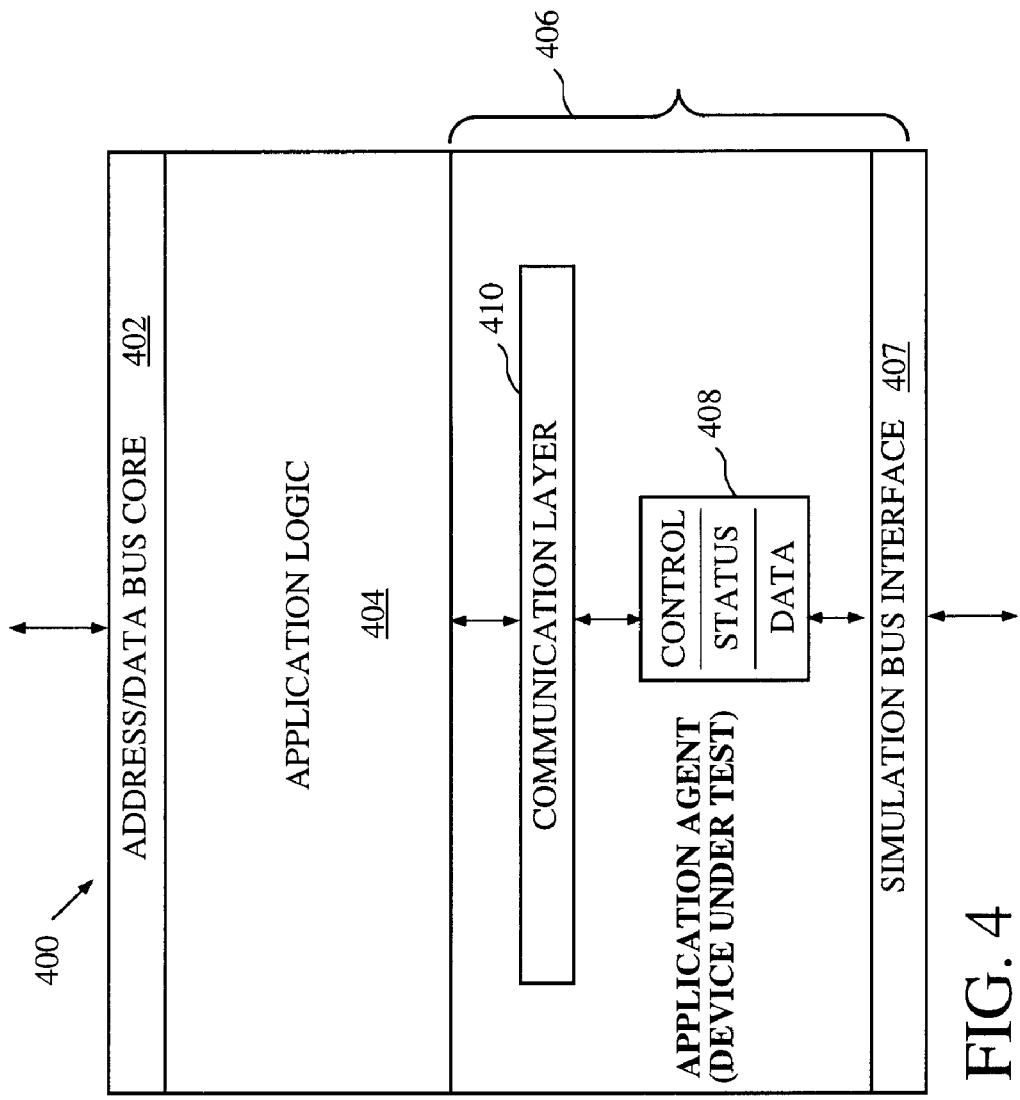
FIG. 4 is a block diagram of an example application agent according to an example embodiment of the invention.

FIG. 4 is a block diagram of an example application agent 400 according to an example embodiment of the invention. The agent 400 includes bus core logic 402 interfaced with application logic 404. Wrapper logic 406 is implemented to provide an interface between application logic 404 and an example simulation controller 208.

The general function of wrapper logic 406 is to map control, status, and data from application logic 404 to an address space that is addressable by simulation controller 208. Example wrapper logic 406 includes a simulation bus interface 407, a simulation command memory 408, and a communication layer 410.

Simulation command memory 406 maps variables, signals, and/or arrays to address space that is accessible to simulation controller 208. For example, this can be accomplished by providing a simulation command address from the simulation controller to a "case" logic programming statement. Control information includes directives that are provided to application logic 404; Status information includes various conditions of application logic 404 that are reported back to simulation controller 208. The data space is used to capture data received by application logic 404 over an example bus 104, as well as to store data to be transmitted from application logic 404 over bus 104.

Communication layer 410 provides a signaling mechanism between the application logic and the variables/arrays of simulation command memory 408. The features of the user's application logic 404 that can be tested are determined by the design of the communication layer, which therefore should be designed to emulate the real-world system with which application logic 404 interfaces.

Figure 5:
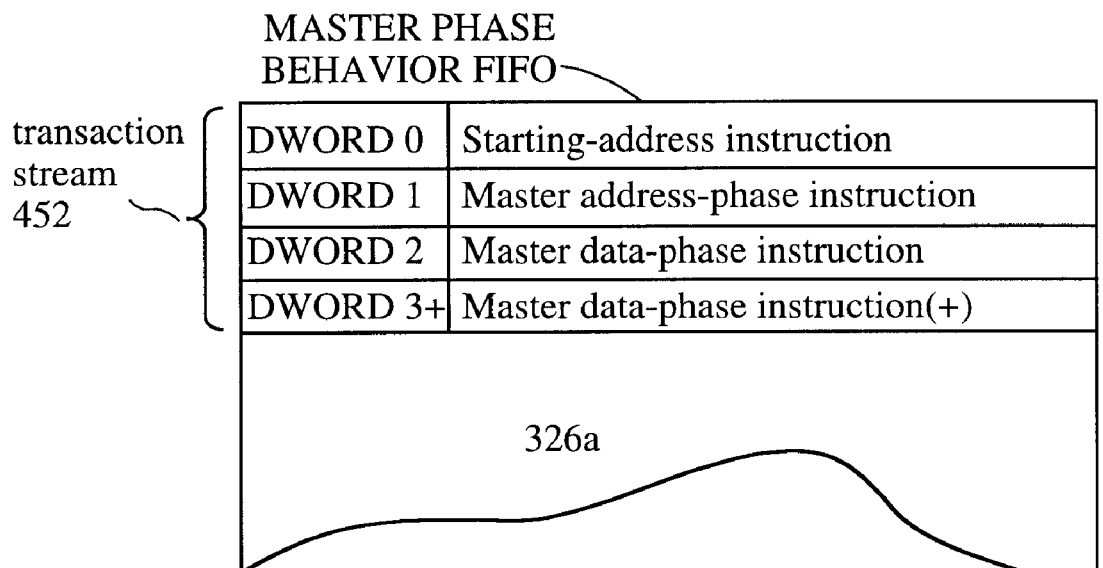
FIG. 5 illustrates a series of phase behavior instructions in a master agent.
Figure 6:
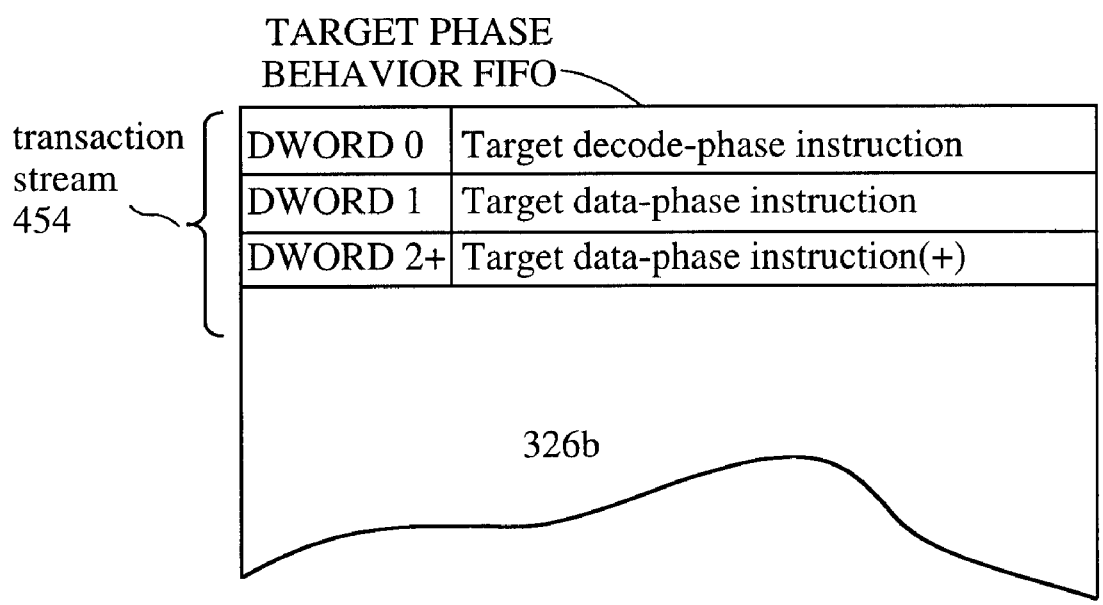
FIG. 6 illustrates a series of phase behavior instructions in a target agent.

FIGS. 5 and 6 illustrate a series of phase behavior instructions in a master agent and a target agent, respectively. The master agent's phase behavior FIFO 326a includes a transaction stream 452 having a starting-address instruction, an address-phase instruction, and two data-phase instructions. The target's phase behavior FIFO includes a transaction stream 454 having a decode-phase instruction and two data-phase instructions. Transaction streams are written to an agent's FIFO 326 in the same order they are to be executed. As explained below, the phase behavior instructions of the master's transaction stream differ from those of the target.

In the master transaction stream 452, the starting-address instruction indicates the starting address of the upcoming transaction. The following master address-phase instruction calls out the command to use relative to bus 104, the address mode, and whether to use the 64-bit data path. The master address-phase instruction represents one cycle of time for bus 104. Each of the master data-phase instructions represents one data phase and indicates how many wait states to insert before asserting IRDY#, whether FRAME# should be deasserted, whether incorrect parity should be generated, as well as other behaviors. The length of time that each of the master data-phase instructions represents is based on how many wait states are called out, as well as whether the target agent inserts additional wait states. The last master data-phase instruction should always indicate a deassertion of FRAME#.

In an example target transaction stream 454, the target decode-phase instruction indicates the decode speed the target should use, for example, the number of cycles between FRAME# assertion and DEVSEL# assertion. The decode-phase instruction also indicates, for example, whether to acknowledge a 64-bit transfer request and when to assert TRDY#. One or more target data-phase instructions can follow the decode-phase instruction, each representing a subsequent data phase. Specifically, behaviors programmed by the data-phase instruction include, for example, how many wait states to insert before assertion of TRDY#, whether STOP# should be asserted, and other behaviors. The length of time that each of the data-phase instructions represents is based on how many wait states are called out, as well as whether the master inserts additional wait states.

The following tables illustrate example formats for the phase behavior instructions, including the starting-address instruction, the master address-phase instruction, the master data-phase instruction, the target decode-phase instruction, and the target data-phase instruction. Each table defines the bits of a 32-bit word that are used to specify the desired behavior. Each Bit, or sequence of bits has an associated Value that specifies a behavior. The Description describes the behavior associated with the possible values of the bits. The Name of the bit(s) is used as a shorthand reference to the bit(s).

The starting-address instruction shown in the table below calls out the starting address of a transaction, for example, a PCI transaction. A master-enabled behavioral agent uses this instruction not only as the address it sends during the address phase of a transaction, but also as the address within the agent's simulation command memory from which it retrieves or to which it stores data.

Starting-Address Instruction

| BITS | VALUE | NAME | DESCRIPTION |
|------|-------|------|-------------|
| 31-2 | Any | start_address | Bits 31-2 of the PCI starting address of the next transaction |
| 1 | 0/1 | N/A | Indicates the address width. (0 = 32-bit, 1 = 64-bit) |
| 0 | 0 | N/A | Indicates a starting-address instruction |

The master address-phase instruction, as shown in the table below, describes the behavior of a behavior master from, for example, the bus-idle state up through the first PCI clock cycle during which it asserts FRAME#. This instruction, as well as others that are described below, permit the specification of behavior that is non-compliant with the protocol of the example bus 104. This is most useful in cases where the user must test handling of or recovery from such non-compliant events by application agent 206.

Master Address-Phase Instruction

| BITS | VALUE | NAME | DESCRIPTION |
|------|-------|------|-------------|
| 31 | 0/1 | par_correct | Generate correct parity on PAR if set to 1 |
| 30 | 0/1 | par64_correct | Generate correct parity on PAR64 if set to 1 |
| 29-26 | Any | pci_command | PCI command to use for this transaction |
| 25-24 | Any | req64_event | Clock cycle after FRAME# assertion on which REQ64# should be asserted; must be 00b for compliance, or 11b if REQ64# should not be asserted |
| 23-22 | Any | address_mode | PCI address mode (e.g., 00b = Linear Incrementing Burst) |
| 21-8 | 0 | N/A | Reserved |
| 7-4 | Any | frame_event | Minimum number of wait cycles to insert between transactions (idle cycles before reassertion of FRAME#); a zero permits a fast back-to-back transaction. The number of idle cycles will never be less than this number, but may be more if (and only if) GNT# latency requires greater idle time. |
| 3 | Any | N/A | Reserved |
| 2-0 | 101b | N/A | Indicates a master address-phase instruction |

The master data-phase instruction described in the table below specifies the behavior of a master agent from the start of a data phase to the end of the data phase. In bus 104, the data phase ends when IRDY# is asserted on the same clock edge as when TRDY# and/or STOP# is asserted. The data phase, therefore, may extend past the assertion of IRDY# if the target inserts more wait states than the master.

Master Data-Phase Instruction

| BITS | VALUE | NAME | DESCRIPTION |
|------|-------|------|-------------|
| 31 | 0/1 | par_correct | Generate correct parity on PAR if set to 1 (PCI writes only) |
| 30 | 0/1 | par64_correct | Generate correct parity on PAR64 if set to 1 (PCI writes only) |
| 29 | 0/1 | perr_always | If 1, assert PERR# unconditionally for the cycle indicated by perr_event (bits 23-20), even if parity is correct (PCI reads only, non-compliant behavior) |
| 28 | 0/1 | perr_wait | If 1, wait until the target's TRDY# signal to issue PERR# (PCI reads only) |
| 27-24 | Any | req64_event | Clock cycle on which to deassert REQ64#. Because REQ64# must mirror FRAME#, setting this value different from frame_event (bits 7-4) results in non-compliant behavior. This field has no effect if REQ64# has not been asserted during the transaction. Setting this field to 1111b causes this event not to occur. |
| 23-20 | Any | perr_event | Clock cycle on which to first check parity and flag PERR#, if necessary (PCI reads only). Setting this field to 1111b causes parity not to be checked. |
| 19-16 | Any | ad_event | Clock cycle on which to drive data onto AD (PCI writes only), must be equal to or less than irdy_event (bits 11-8) to be PCI compliant |
| 15-12 | Any | cbe_event | Clock cycle on which to drive a new set of byte enables onto C/BE#, must be 0 to be PCI compliant |
| 11-8 | Any | irdy_event | Clock cycle on which to assert IRDY#. Setting this field to 1111b causes this event not to occur. |
| 7-4 | Any | frame_event | Clock cycle on which to deassert FRAME#, must equal irdy_event (last data phase) to be PCI compliant. Setting this event not to occur. |
| 3 | 0 | N/A | Reserved |
| 2-0 | 111b | N/A | Indicates a master data-phase instruction |

The target decode-phase instruction describes the behavior of a behavior target from the clock cycle after the address phase to either: (1) the initial phase if TRDY# and/or STOP# is asserted, or (2) the first cycle on which DEVSEL# is asserted if neither TRDY# nor STOP# is asserted.

Target Decode-Phase Instruction

| BITS | VALUE | NAME | DESCRIPTION |
|------|-------|------|-------------|
| 31 | 0/1 | par_ | Generate correct parity on PAR if set to 1 (PCI reads only) |
| 30 | 0/1 | par64_correct | Generate correct parity on PAR64 if set to 1 (PCI reads only) |
| 29 | 0/1 | perr_always | If 1, assert PERR# unconditionally for the cycle indicated by perr_event (bits 23-20), even if parity is correct (PCI writes only, non-compliant behavior) |
| 28 | 0/1 | perr_wait | If 1, wait until the master's IRDY# signal to issue PERR# (PCI writes only) |
| 27 | 0/1 | ack64_always | If 1, assert ACK64# unconditionally |

-continued

Target Decode-Phase Instruction

| BITS | VALUE | NAME | DESCRIPTION |
|------|-------|------|-------------|
| | | | even in the absence of REQ64# (non-compliant behavior) |
| 26-24 | Any | ack64_event | Clock cycle on which to assert ACK64# to be asserted as per the decode-speed setting from the live configuration space at the time the decode-phase instruction is executed. If this is greater than devsel_event (bits 7-4) or if it is set to 111b, ACK64# is not asserted. |
| 23-20 | Any | perr_event | Clock cycle on which to first check parity and flag PERR#, if necessary (PCI writes only). Setting this field to 111b causes parity not to be checked. |
| 19-16 | Any | ad_event | Clock cycle on which to drive data onto AD (PCI reads only), must be equal to or less than trdy_event (bits 11-8) to be PCI compliant. |
| 15-12 | Any | stop_event | Clock cycle on which to assert STOP#. Setting this field to 1111b causes this event not to occur. |
| 11-8 | Any | trdy_event | Clock cycle on which to assert TRDY#. Setting this field to 1111b causes this event not to occur. |
| 7-4 | Any | devsel_event | Clock cycle on which to assert DEVSEL#, must be equal to or less than trdy_event to be PCI compliant. Writing all x's causes DEVSEL# to be asserted as per the decode-speed setting from the live configuration space at the time the decode-phase instruction is executed. |
| 3 | 0 | N/A | Reserved. |
| 2-0 | 001b | N/A | Indicates a target decode-phase instruction. |

The target data-phase instruction describes the behavior of a behavioral target from the start of a data phase to the end of the data phase. The data phase ends, for example, when TRDY# and/or STOP# is asserted on the same clock edge with IRDY#. The data phase, therefore, may extend past the assertion of TRDY# and/or STOP# if the master inserts more wait states than the target.

Target Data-Phase Instruction

| BITS | VALUE | NAME | DESCRIPTION |
|------|-------|------|-------------|
| 31 | 0/1 | par_correct | Generate correct parity on PAR if set to 1 (PCI reads only). |
| 30 | 0/1 | par64_correct | Generate correct parity on PAR64 if set to 1 (PCI reads only). |
| 29 | 0/1 | perr_always | If 1, assert PERR# unconditionally for the cycle indicated by perr_event (bits 23-20), even if parity is correct (PCI reads only, non-compliant behavior) |
| 28 | 0/1 | perr_wait | If 1, wait until the master's IRDY# signal to issue PERR# (PCI writes only). |
| 27-24 | 0/1 | ack64_event | Clock cycle on which to deassert ACK64#. Because ACK64# must mirror DEVSEL#, setting this value different from devsel_event (bits 7-4) results in non-compliant behavior. This field has no effect if ACK64# has not already been asserted during the transaction. |
| 23-20 | Any | perr_event | Clock cycle on which to first check parity and flag PERR#, if necessary (PCI writes only). Setting this field to 1111b causes parity not to be checked. |
| 19-16 | Any | ad_event | Clock cycle on which to drive data onto AD (PCI reads only), must be equal to or less than trdy_event (bits 11-8) to be PCI compliant. |
| 15-12 | Any | stop_event | Clock cycle on which to assert STOP#. Setting this field to 1111b causes this event not to occur. |
| 11-8 | Any | trdy_event | Clock cycle on which to assert TRDY#. Setting this field to 1111b causes this event not to occur. |
| 7-4 | Any | devsel_event | Clock cycle on which to deassert DEVSEL#. Setting this field to 1111b causes this event not to occur. Note that the behavioral agent automatically deasserts DEVSEL# after the final data phase (IRDY# asserted, FRAME# deasserted), so this field should be set to a non-1111b value only when issuing a Target Abort. |
| 3 | 0 | N/A | Reserved |
| 2-0 | 001b | N/A | Indicates a target data-phase instruction |

The behavioral agents include the capability to process several simulation commands that help eliminate some of the complexity that accompanies constructing phase-behavior instructions and interpreting transaction records. These simulation commands are extensions to the primitive simulation commands described above and examples include WRITE_START_ADDRESS, WRITE_PHASE_BEHAVIOR, SETUP_MASTER_TRANSACTION, and SETUP_TARGET_TRANSACTION.

The WRITE_START_ADDRESS task writes a starting-address instruction to the phase-behavior queue of the specified agent. For addresses greater than or equal to $2^{32}$, the WRITE_START_ADDRESS task breaks the address into two phase behavior DWORDs. The syntax of the WRITE_START_ADDRESS simulation command is "WRITE_START_ADDRESS (who);" where "who" indicates the agent to which the starting-address instruction is to be written. The WRITE_START_ADDRESS task requires "field assignments" to be made before the task is executed. The assignments involve assigning value to fields of the instruction. The field that is associated with the starting-address instruction is assigned a value selected by the user, as described in the table above.

The WRITE_PHASE_BEHAVIOR task writes a phase-behavior instruction to phase-behavior FIFO 326 or to default phase configuration space 324. The syntax of the WRITE_PHASE_BEHAVIOR simulation command is: "WRITE_PHASE_BEHAVIOR (who, instruction-type);" where "who" indicates the agent to which the instruction is to be written, and "instruction-type" indicates one of a master address-phase, a master data-phase, a target decode-phase, a target data-phase, or default instructions for each of the foregoing instructions. The fields that are associated with each of the instructions are assigned values as selected by the user. The values and behaviors are described in the tables above for each of the instructions.

The SETUP_MASTER_TRANSACTION task sets up a complete master transaction stream by issuing a series of WRITE_PHASE_BEHAVIOR simulation commands. Syntax for the SETUP_MASTER_TRANSACTION simulation command is: "SETUP_MASTER_TRANSACTION (who, start_address, bus_command, num_phases, use_64?, first_phase_length, second_phase_length, middle_phase_length, last_phase_length);" where "who" indicate the agent to receive the master transaction stream, and "start_address" indicates the starting address of the transaction. The "bus_command" is, for example, a PCI bus command, and "num_phases" indicates how many data phases should be written to the transaction stream. The "use_64?" argument indicates whether the master should assert REQ64#. The last four arguments specify the phase profile for each of the respective data phases. In the example embodiment, the nomenclature follows common PCI literature.

The SETUP_TARGET_TRANSACTION task sets up a complete master transaction stream by issuing a series of WRITE_PHASE_BEHAVIOR simulation commands. The syntax for the SETUP_TARGET_TRANSACTION simulation command is: "SETUP_TARGET_TRANSACTION (who, num_phases, use_64?, first_phase_length, second_phase_length, middle_phase_length, last_phase_length, termination_type);" where "who" indicate the agent to receive the target transaction stream. The "num_phases" argument indicates how many data phases should be written to the transaction stream. The "use_64?" argument indicates whether the target should assert ACK64#. The last four arguments specify the phase profile for each of the respective data phases. The target agent will terminate the transaction in accordance with the "termination_type" parameter, providing for normal and abnormal terminations.

FIGS. 7–10 are timing diagrams that illustrate various simulation scenarios using the previously described phase-behavior instructions. Each of the timing diagrams illustrates a simulation using an example PCI bus 104.

Figure 7:
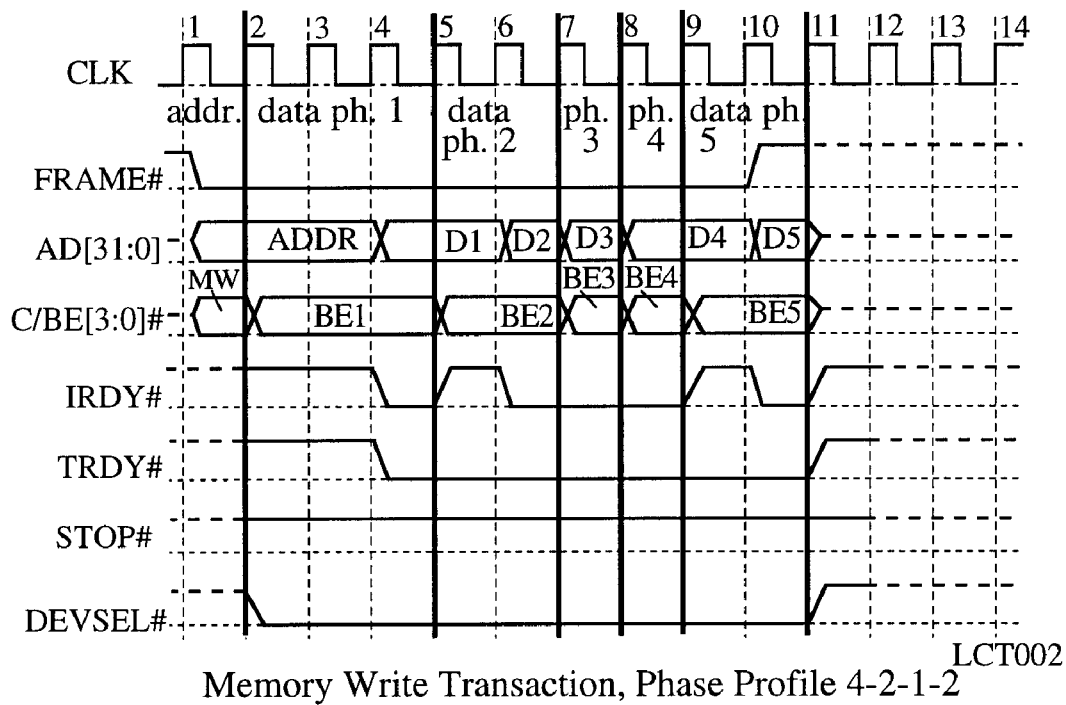
FIG. 7 is a timing diagram for a 32-bit memory write transaction that requires five data phases.

FIG. 7 is a timing diagram for a 32-bit memory write transaction that requires five data phases. The master is generic behavioral agent 204 (FIG. 2), and the target is application agent 206, for example. The data phases end on clock edges 5, 7, 8, 9, and 11 when both IRDY# and TRDY# are asserted. The target performs fast decode and zero-wait-state burst. Data changes on AD in concert with IRDY# during each data phase.

This transaction illustrates a transaction-level setup for a memory write bus operation using the SETUP_MASTER_TRANSACTION simulation command. Because the target is an application agent 206, only master behavioral agent 204 needs to be configured with the transaction stream. The master is stopped from issuing bus commands, and the C/BE space 306 (FIG. 3) is configured in accordance with the user's simulation scenario. The transaction can be set up on the master agent with the simulation command "SETUP_MASTER_TRANSACTION ('MASTER, ADDR, MemoryWrite, 5, Data32, 4, 2, 1, 2);" wherein the first data phase requires 4 bus cycles, including the address phase, the second phase requires 2 cycles, the middle phases 3 and 4 require 1 cycle, and the last phase requires 2 cycles. Another simulation command is then issued to initiate processing of the transaction by the master agent.

Figure 8:
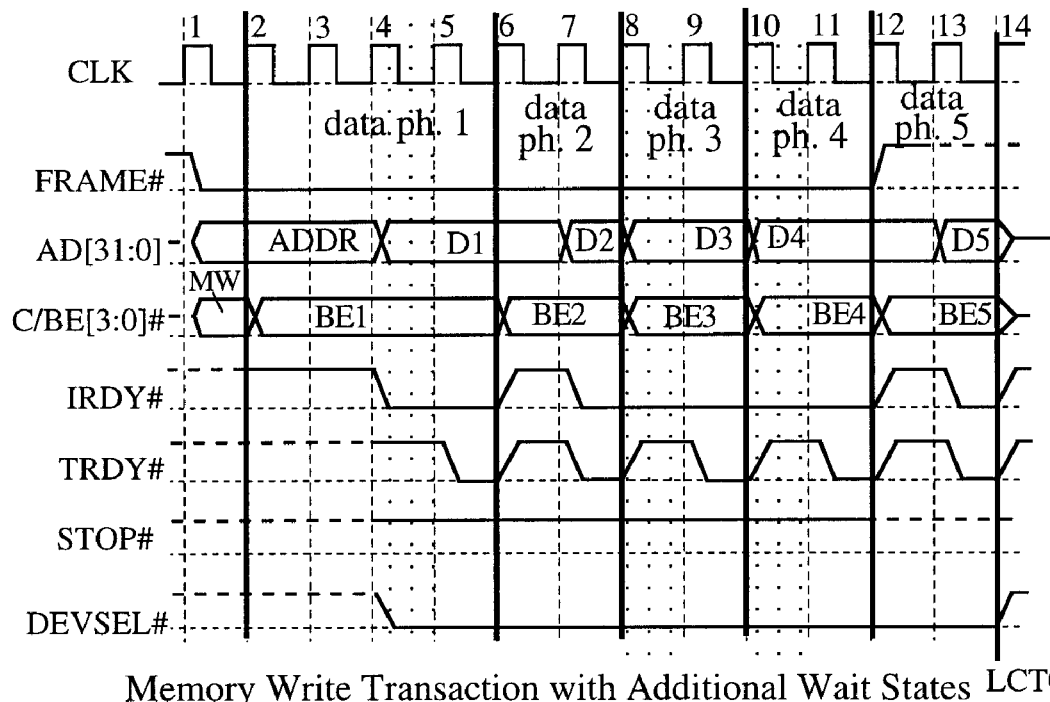
FIG. 8 is a timing diagram for a 32-bit memory write transaction where the target application agent inserts wait states.

FIG. 8 is a timing diagram for a 32-bit memory write transaction where target application agent 206 inserts wait states. The same SETUP_MASTER_TRANSACTION is issued for this scenario as for the scenario of FIG. 7.

Target application agent 206 inserts wait states at cycles 4, 8, and 10 when IRDY# is asserted but TRDY# is not asserted. Master behavioral agent 204 responds by keeping IRDY# asserted until the target asserts TRDY#. The three extra cycles result in a phase profile of 5-2-2-2, even though the master was configured with a phase profile of 4-2-1-2. This example illustrates how the master behavioral agent responds in compliance with the PCI protocol of bus 104 when target agent 206 inserts wait states. Thus, unless the transaction stream of the master agent specifies non-compliant behavior, the master agent will behave in accordance with the bus protocol.

Figure 9:
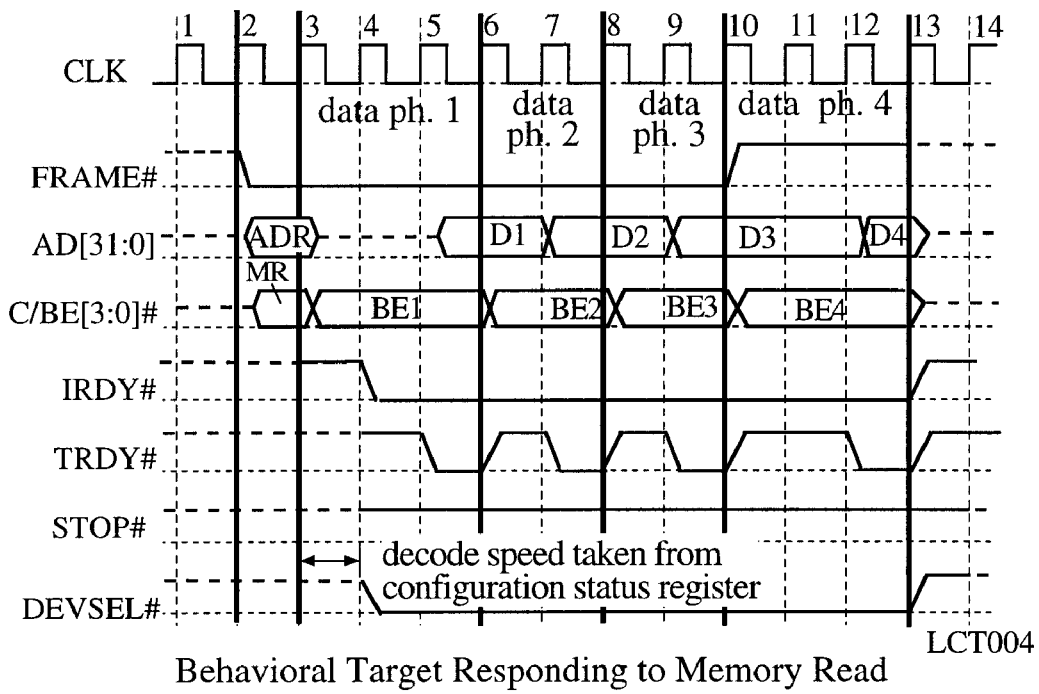
FIG. 9 is a timing diagram of a simulation scenario where the behavioral agent is the target of the transaction, and the application agent is the master agent or the "initiator" of the transaction.

FIG. 9 is a timing diagram of a simulation scenario where behavioral agent 204 is the target of the transaction, and application agent 206 is the master agent or the "initiator" of the transaction. Target agent 204 has been configured with a transaction stream using the simulation command: SETUP_TARGET_TRANSACTION ('TARGET, 4, Data32, 4, 2, 2, 3, MasterNormal);" wherein a transaction having 4 data phases is specified. The phase profile of the transaction is 4-2-2-3. The "MasterNormal" argument tells the target agent 204 not to assert STOP# during the transaction.

The following behaviors are illustrated in the diagram. Although the target is not active on the bus during the address phase, the address phase is included in the cycle count when providing the phase profile to SETUP_TARGET_TRANSACTION. The SETUP_TARGET_TRANSACTION task always uses the default decode speed from the status register in the agent's live configuration space 324. The specified phase profile assumes zero wait states are inserted by the master agent. The TRDY# and STOP# signals are never driven until DEVSEL# is asserted. Therefore, TRDY# and STOP# always behave in compliance with the protocol of bus 104 at the start of a transaction, even if the phase profile is less than the default decode speed. The behavior target agent always enforces TRDY# turnaround cycle after the address phase of any write transaction, regardless of the initial phase setting in the phase profile.

Figure 10:
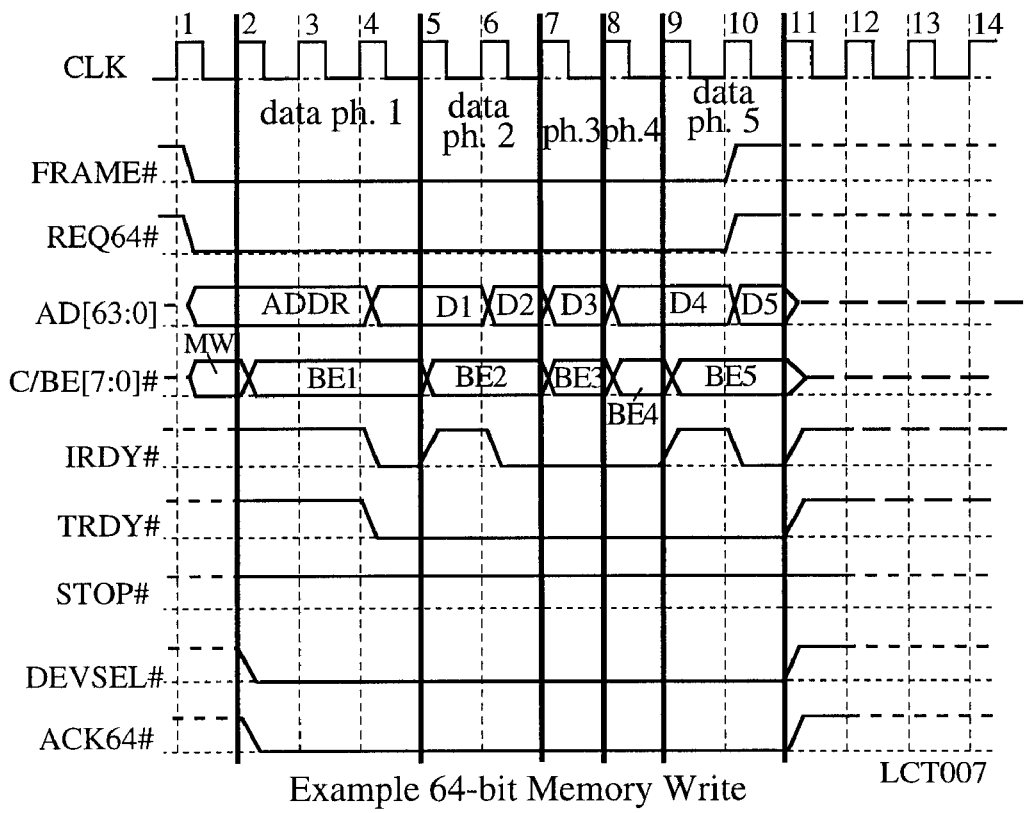
FIG. 10 is a timing diagram that illustrates a memory write transaction using a 64-bit extension of the bus.

FIG. 10 is a timing diagram that illustrates a memory write transaction using a 64-bit extension of bus 104. As in FIG. 7, behavior agent 204 is the master agent, and application agent 206 is the target agent. The signal timing of FIG. 10 is similar to that of FIG. 7, except that REQ64# and ACK64# are asserted during the transaction, and the data are each 64 bits wide, and the byte enables are each 8 bits wide. The illustrated transaction transfers ten DWORDs instead of five.

A first example distinction in setting up a 64-bit transaction versus a 32-bit transaction is that two WRITE_MEM simulation commands are required to reference data spaces 308 and 310 for each 64-bit word. A second distinction is that either the master or the target, depending on whether the behavioral agent is configured as the master or the target, needs to be configured for use of the 64-bit data path.

In the example embodiments described herein, generally unless a signal sequence that is non-compliant with the bus protocol is specified in a phase instruction, it is assumed that the agent processing the instruction is configured to issue and respond to control, address, and data signals in a manner that is compliant with the bus protocol. Because bus protocols vary, and those skilled in the art recognize how to implement bus agents that adhere to various bus protocols, detailed bus protocol processing will not be described herein.

Figure 11:
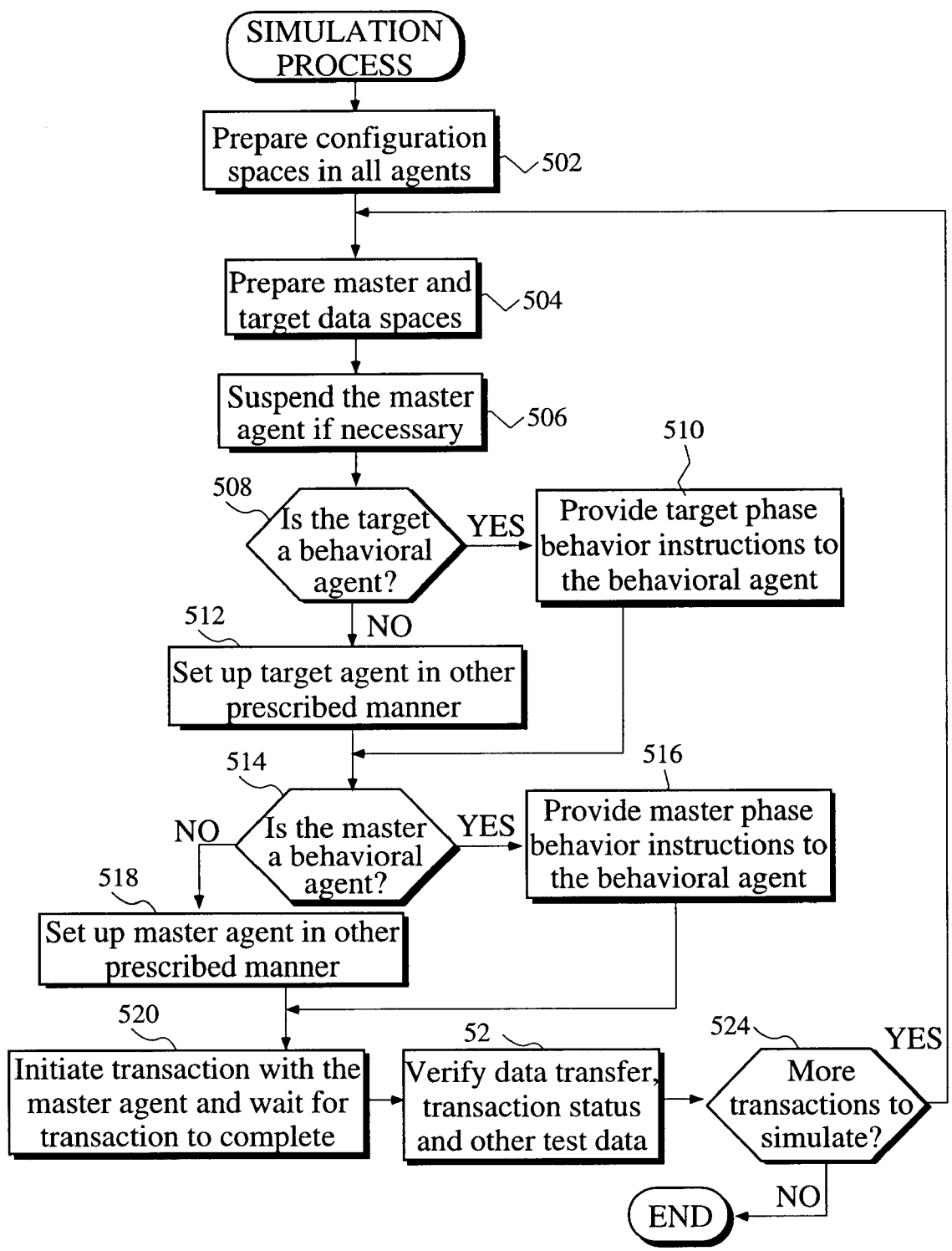
FIG. 11 is a flowchart of a process for simulating bus behavior of an application agent in accordance with an example embodiment of the invention.

FIG. 11 is a flowchart of a process for simulating bus behavior for an application agent in accordance with an example embodiment of the invention. The process generally entails preparing selected agents with configuration data and phase behavior instructions for a selected transaction, initiating the transaction with the master agent, and verifying the simulation results.

At step 502, the bus configuration spaces 304 of selected agents are prepared with selected configuration data. The configuration data includes, for example, assigned address range, settings enabling an agent's master or target logic, settings enabling an agent's error handling, and maximum number of clock cycles a master is allowed to spend on data bus 104. At step 504, the data spaces for the selected master and target agents are prepared. For example for a write transaction, the master agent's data space is prepared by writing selected data to the data space via simulation control bus 210.

At step 506, the master agent is suspended if the master agent is behavioral agent 204. The following sequence of steps sets up the master and target agents with phase behavior instructions that are selected in accordance with the desired simulation scenario.

If the target agent is behavioral agent 204, step 508 directs control to step 510 where target phase behavior instructions are written to the behavioral agent. Otherwise, if the selected target agent is the application agent, the agent is configured in another prescribed manner. If the target agent is the application agent, it may simply be configured with the number of data phases to process before terminating a transaction. Although not necessarily the case, an application agent generally has fewer modes of behavior than the behavioral agent, and therefore requires simpler simulation control.

If the selected master agent is a behavioral agent, decision step 514 directs control to step 516 where master phase behavior instructions are written to the behavioral agent. Where the selected master is not a behavioral agent, control is directed to step 518, where the master agent is configured with selected data to be transferred.

At step 520, the transaction is then initiated with the master agent. If the master agent is a behavioral agent, the initiation may be accomplished by setting a control bit in bus configuration space 322. If the master agent is an application agent, the initiation may be accomplished by writing to a control bit in control space 408. The process then waits for the transaction to complete.

At step 522, the transaction results are verified by comparing data transfer results to expected data or by examining transaction status data. The results of the verification may then be output to inform the user of the transaction status. As long as there are more transactions to simulate, step 524 returns control to step 504. Otherwise, the simulation process is complete.

Figure 12A:
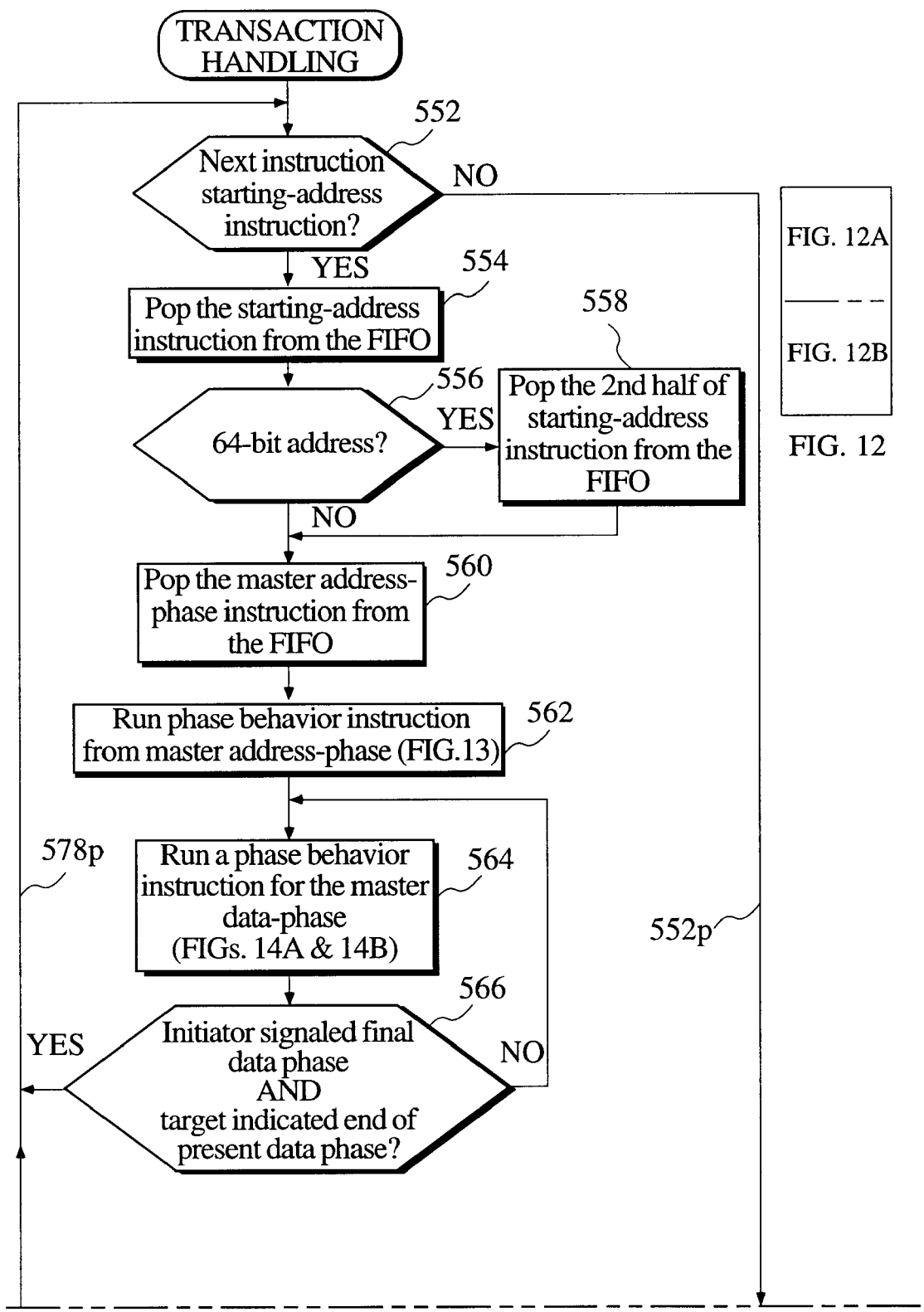
FIG. 12 (comprising FIGS. 12A and 12B) is a flowchart of an example process for transaction handling.
Figure 12B:
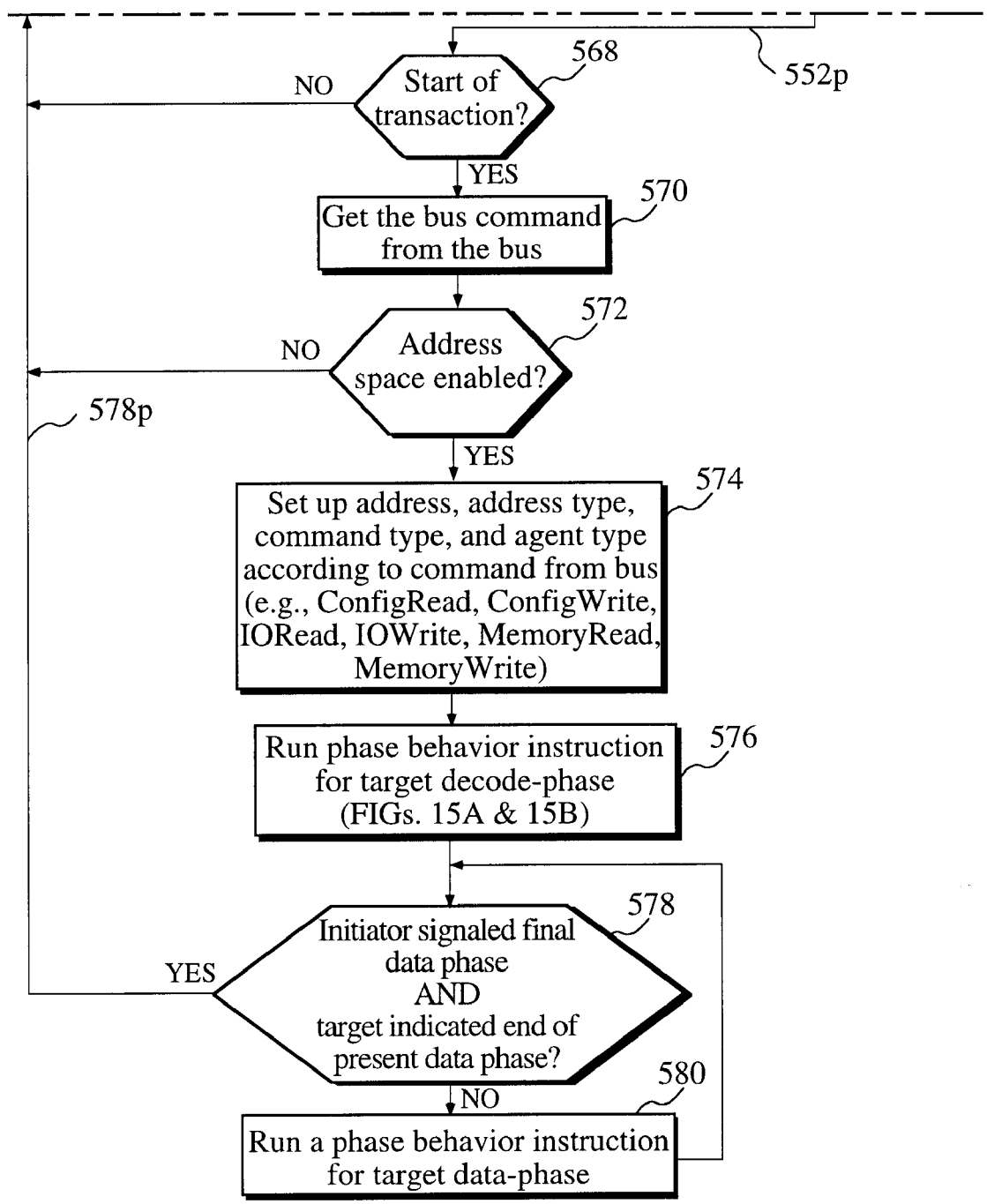

FIG. 12 (comprising FIGS. 12A and 12B) is a flowchart of an example process for transaction handling. The transaction handling process is generally performed by a behavioral agent 204, configured as either a master or a target. The process generally entails first determining whether the behavioral agent is to act as a master or a target, and then processing the phase behavior instructions accordingly.

At step 522, the type of instruction at the top of phase behavior FIFO 326 is determined. If the instruction is a master starting-address instruction, then this means the behavioral agent is to act as a master, and control is directed to step 554. Otherwise, the behavioral agent is to act as a target, and the phase behavior instructions are processed as target phase behavior instructions.

Step 554 pops the master starting-address instruction from FIFO 326, and step 556 tests whether the instruction speci-fies a 64-bit address. If so, step 558 pops the second 32 bits of the starting address from FIFO 326.

Figure 13:
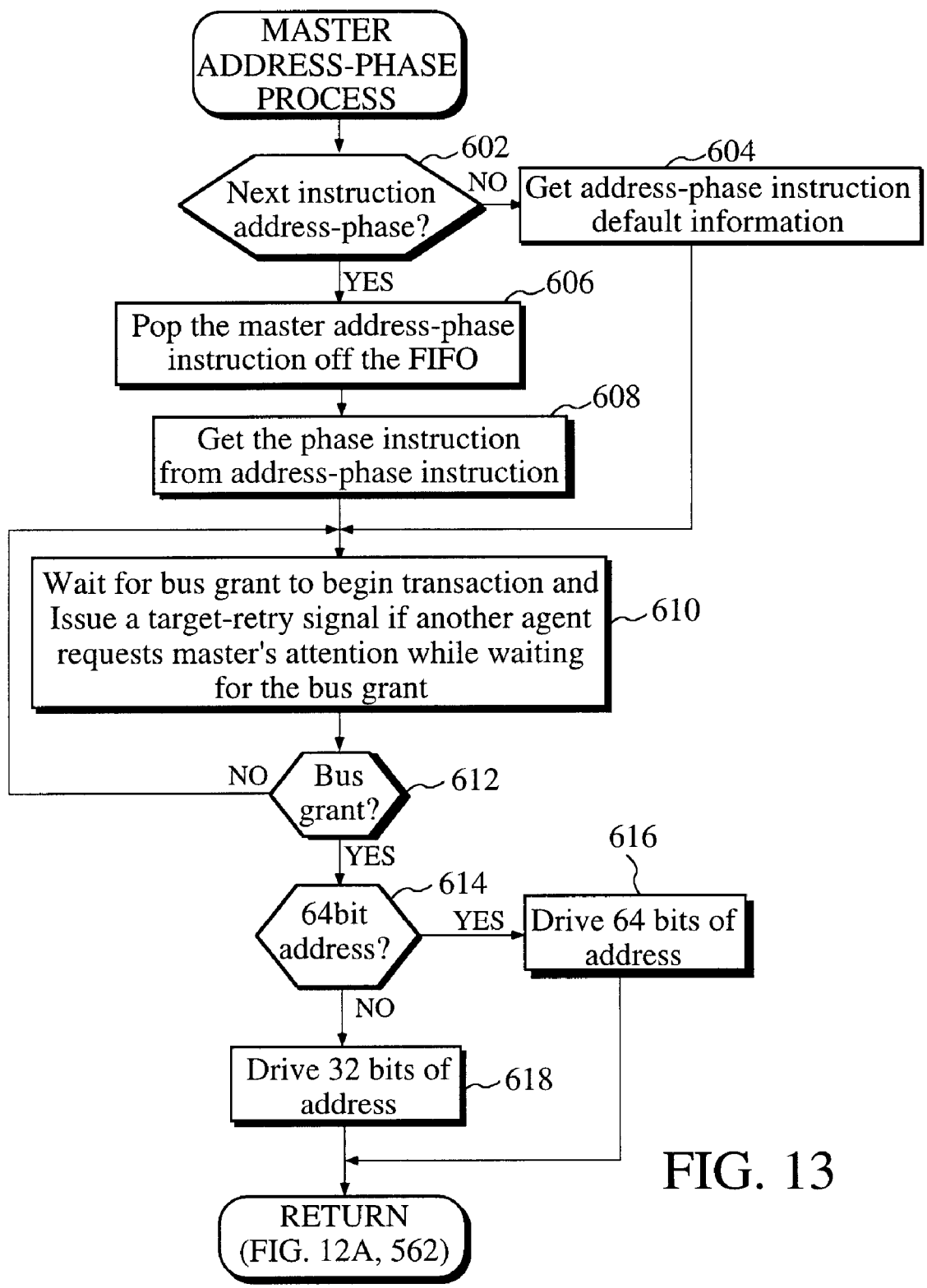
FIG. 13 is a flowchart of a process for running a master address-phase instruction in accordance with an example embodiment of the invention.

At step 560, the master address-phase instruction is then popped from the FIFO, and at step 562 the master address phase instruction is run. The process performed in running a master address-phase instruction is illustrated in FIG. 13.

Master data-phase instructions generally follow the master address-phase instruction in FIFO 326 and are popped and processed as illustrated by step 564. FIG. 14 illustrates an example process for running a master data-phase instruction.

When the initiator signals the final data phase and the target indicates the end of that same data phase, the transaction is complete and control is returned by step 566 to step 552. Otherwise, control is returned to step 564 to process another master data-phase instruction.

If decision step 552 does not find a master starting-address instruction on FIFO 326, control is directed to decision step 568 to begin processing as a target agent. If signals on control lines of bus 104 indicate the start of a transaction, control is directed to step 570. At step 570, the bus command is read from bus 104.

If the address space indicated by the bus command is enabled as determined at step 572, the address, address type, command type, and agent type are obtained from the command at step 574. For example, the command can specify reading from or writing to configuration space 322, memory space 308, or input/output space 310.

At step 576, a target decode-phase behavior instruction is run. An example process for running the target decode-phase instruction is illustrated in FIG. 15. The target behavioral agent continues processing target phase behavior instructions from the FIFO 326 until the initiator (master) signals the final data phase and the target indicates the end of the present data phase, as shown by step 578. Step 580 runs a target data-phase instruction and returns control to step 578. As explained in the discussion that accompanies FIG. 15, the process for running a target data-phase instruction is a subset of the processing performed in running a target decode-phase instruction.

FIG. 13 is a flowchart of a process for running a master address-phase instruction in accordance with an example embodiment of the invention. The process generally entails popping the address-phase instruction from FIFO 326 and driving control and address lines of bus 104 in accordance with the parameters of the address-phase instruction.

Decision step 602 tests whether the next instruction on FIFO 326 is an address-phase instruction. If not, at step 604, the default address-phase instruction is obtained from the default phase configuration space 324. Otherwise, step 606 pops the master address-phase instruction from the FIFO 326. Step 608 obtains the phase information from the parameters of the address-phase instruction.

As shown by steps 610 and 612, the master agent then waits until a bus grant signal is received, for example from the behavioral host 202. If another agent (other than the agent targeted by the master agent) requests the attention of the master prior to the master being granted access to the bus 104, the master agent issues a target-retry signaling sequence to the other agent.

Step 614 tests whether the address-phase instruction specifies 64-bit addressing. If so, as shown by step 616, 64 bits of address data are driven onto bus 104. Otherwise, step 618 drives 32 bits of address data. Control is then returned to the transaction handling process of FIG. 12

Figure 14A:
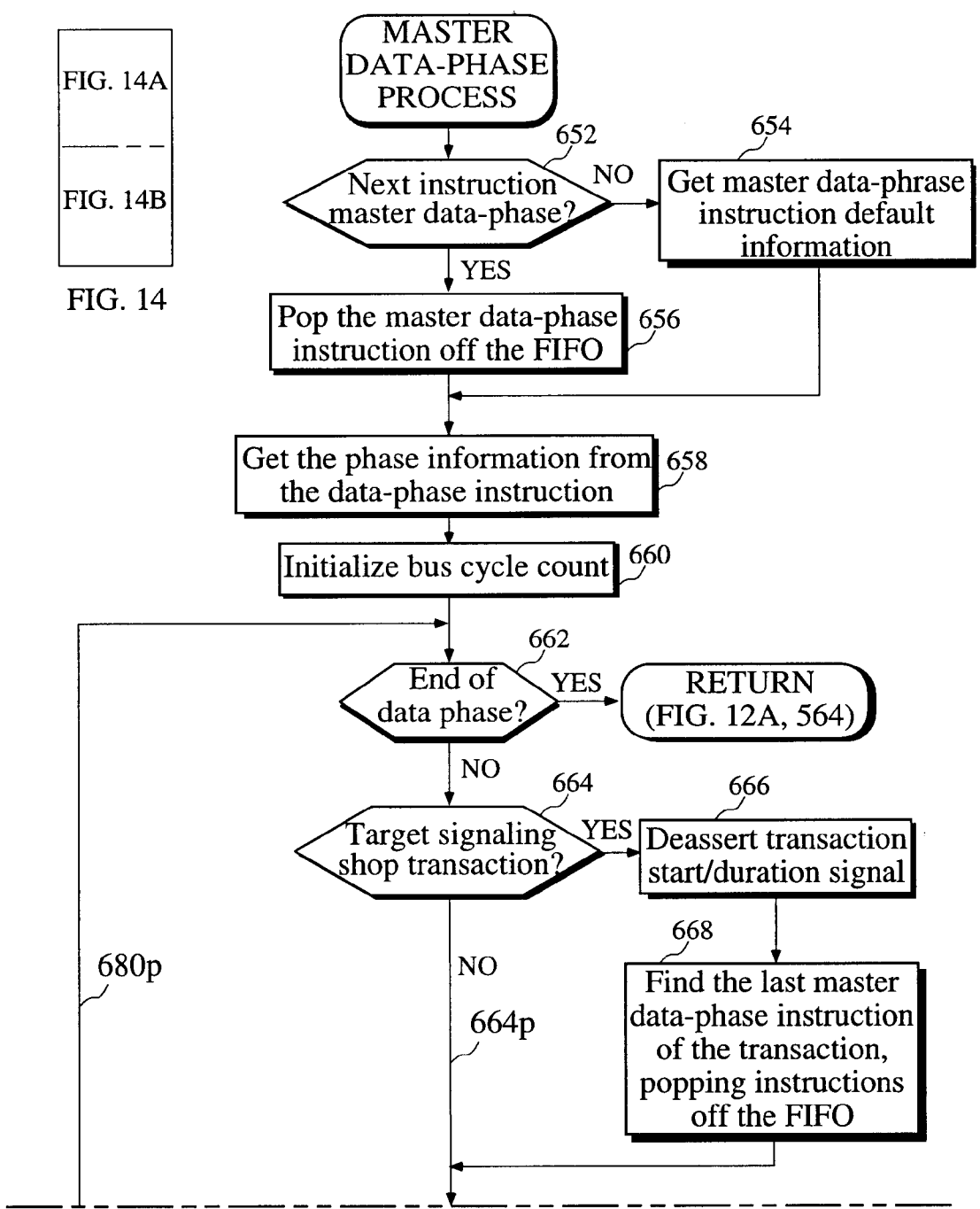
FIG. 14 (comprising FIGS. 14A and 14B) is a flowchart that illustrates an example master data-phase process.
Figure 14B:
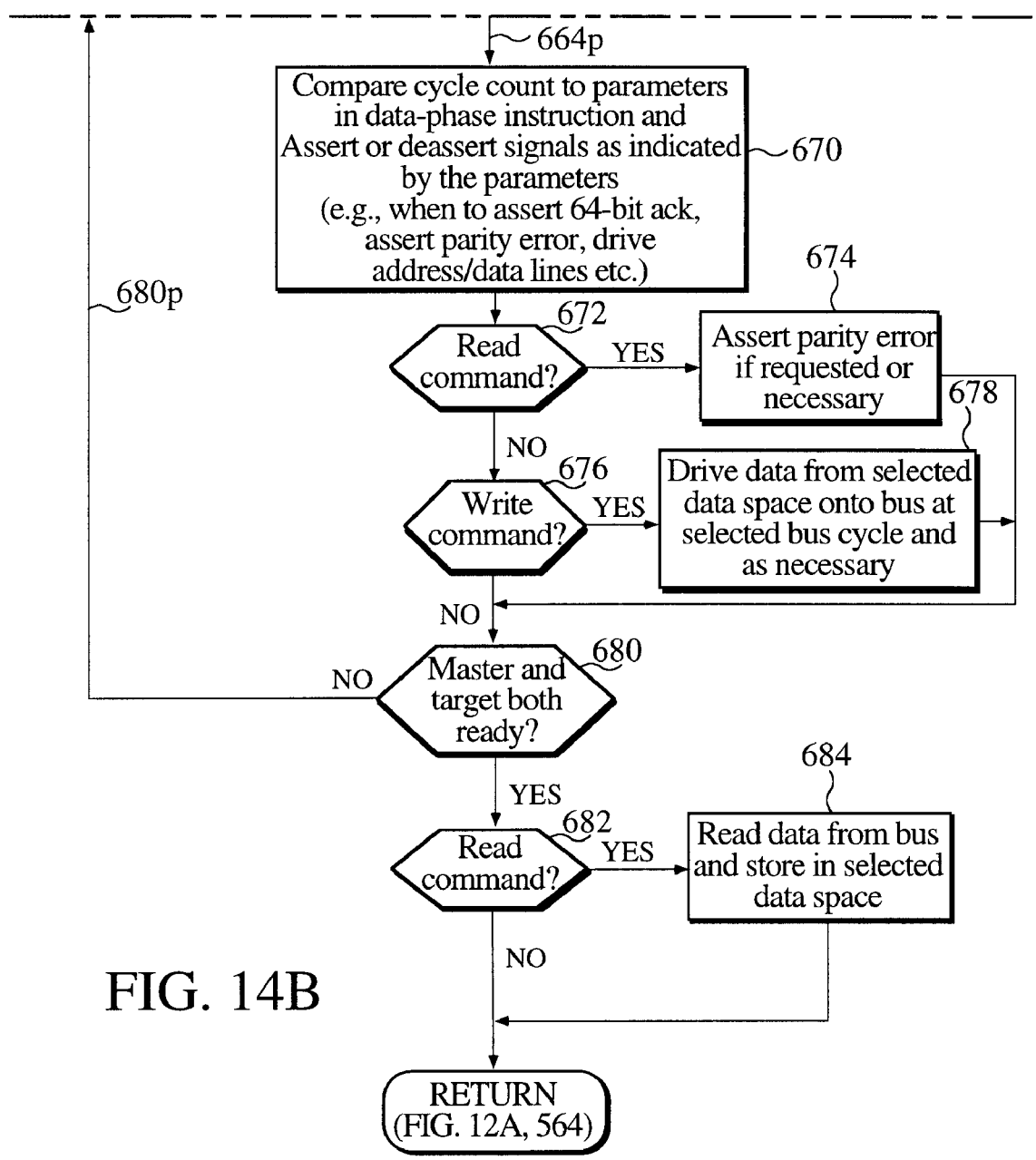

FIG. 14 (comprising FIGS. 14A and 14B) is a flowchart that illustrates an example master data-phase process. The master data-phase process generally entails reading data-phase instructions from master phase behavior FIFO 326a and conforming the data phases of the master agent to those specified in the phase behavior instructions.

Decision step 652 tests whether the instruction at the top of FIFO 326a is a master data-phase instruction. If not, at step 654, a default data-phase behavior instruction is obtained from the default phase configuration space 324. If the instruction is a master data-phase instruction, at step 656 the instruction is popped from FIFO 326a. The data-phase information is obtained from the data-phase instruction, as indicated by step 658.

Step 660 initializes the cycle count, wherein the cycle count is associated with bus 104. The bus cycle count is used in combination with the parameters specified in the data-phase instruction to assert and deassert selected signals at selected times. While not shown, it will be appreciated that the cycle count is incremented by the behavioral agent once during each bus clock cycle.

Decision step 662 tests whether the data phase is complete. For example, the data phase may be terminated by the target agent, as indicated by a disconnect signaling sequence. The data phase may also be terminated by expiration of a timer relative to when the bus was granted to the master. If the data phase has ended, at step 564, control is returned to the transaction handling process of FIG. 12.

If the data phase has not ended, decision step 664 tests whether the target agent is signaling to stop the transaction. If so, at step 666, the master agent deasserts the transaction start and duration signal (e.g., FRAME#). In addition, at step 668, the data-phase instructions remaining in the FIFO 326a are popped and discarded.

Processing continues at step 670, where the bus cycle count is compared with the parameters specified in the data-phase instruction, and selected signals are asserted or deasserted as specified by the parameters. For example, a 64-bit acknowledge signal may be asserted at the appropriate time.

Decision step 672 tests whether a read command is in progress. If so, step 674 asserts a parity error if specified by the data-phase instruction or if there is an actual parity error. If the command is a write command, decision step 676 directs control to step 678 where the selected data is driven on bus 104 at the specified bus cycle.

If the master agent and the target agent are not both ready to proceed (e.g., IRDY# and TRDY# asserted), decision step 680 returns control to step 662. Otherwise, as indicated by step 684, when both the master and the target are ready, and a read command is in progress (decision step 682), data is read from bus 104 and stored in the selected data space. The read completes the process and control is returned to step 564 of FIG. 14.

Figure 15A:
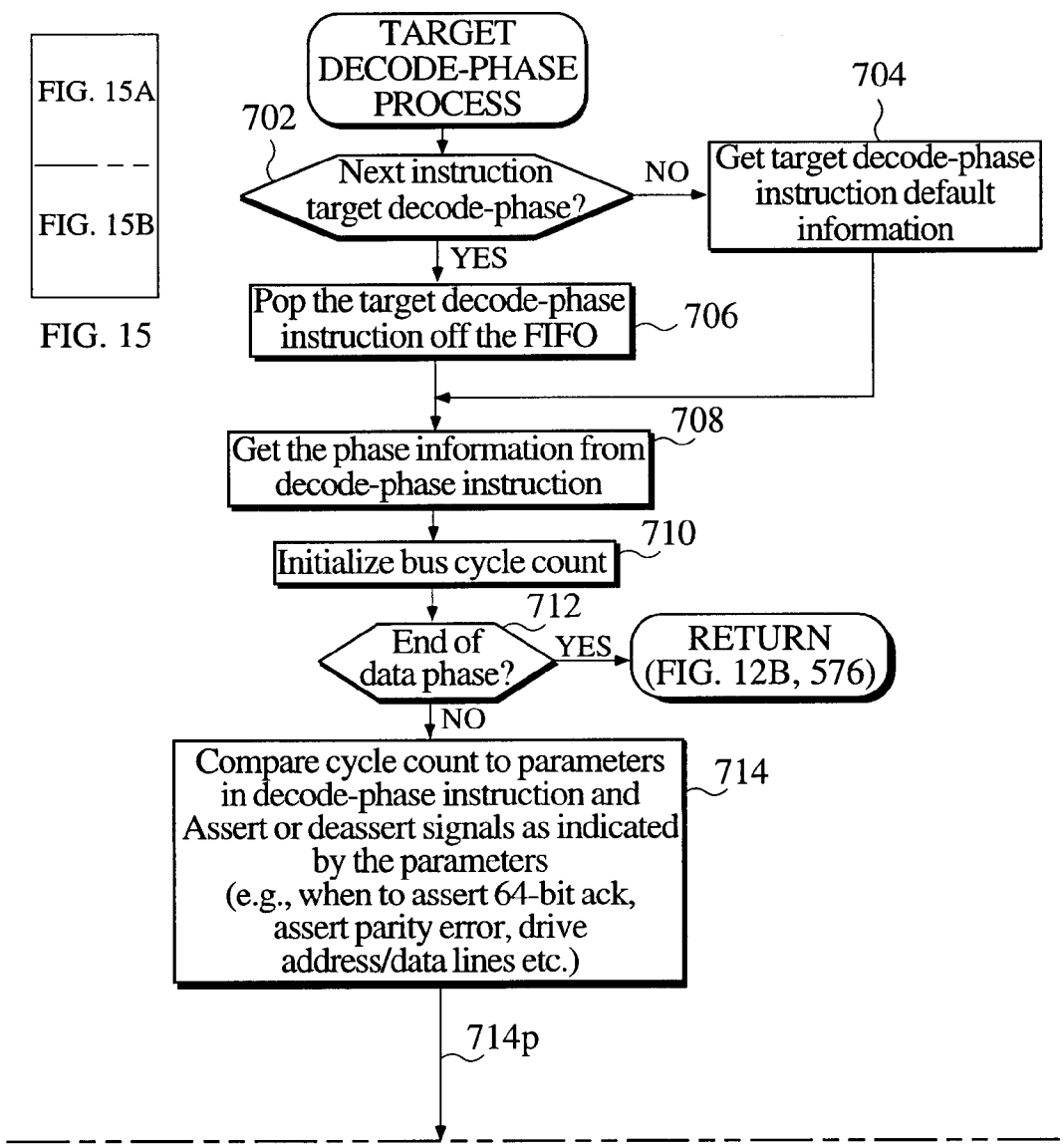
FIG. 15 (comprising FIGS. 15A and 15B) is a flowchart of an example target decode-phase process.
Figure 15B:
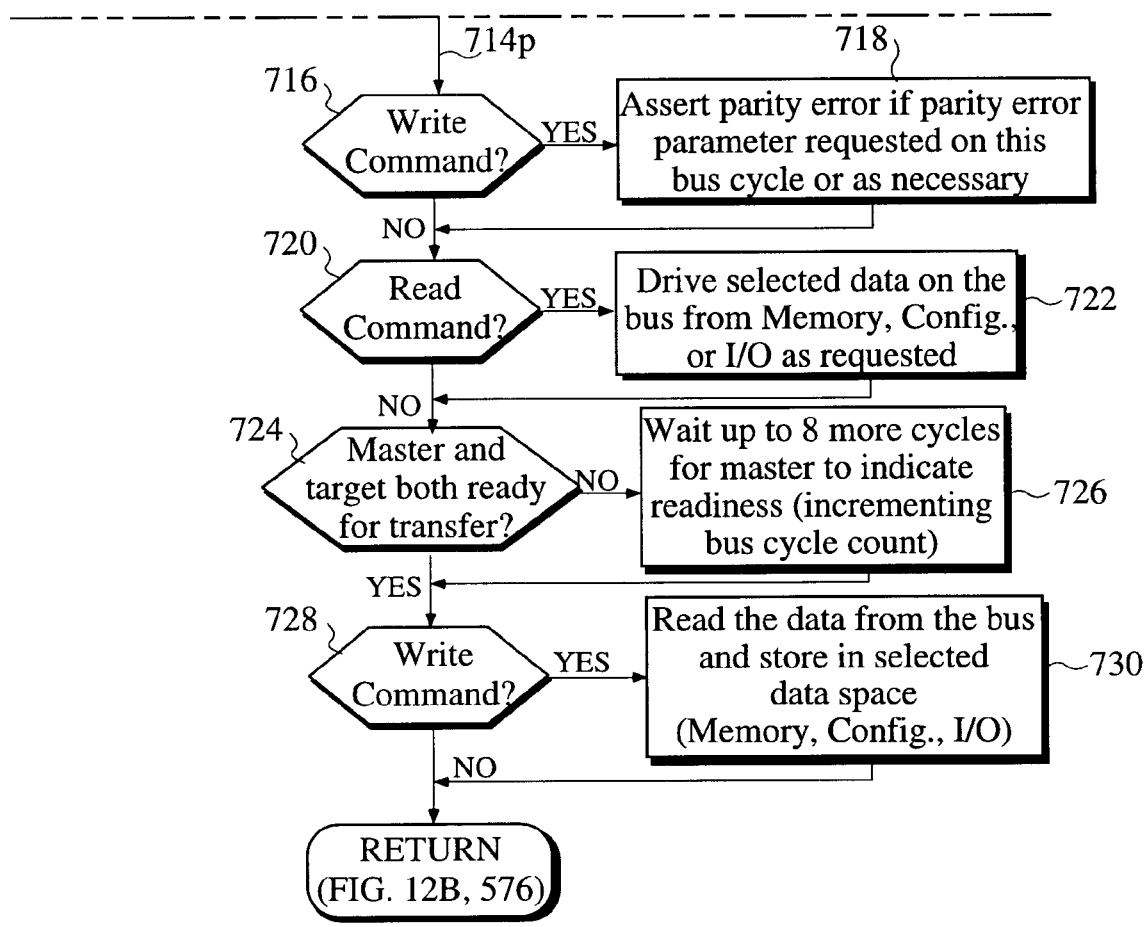

FIG. 15 (comprising FIGS. 15A and 15B) is a flowchart of an example target decode-phase process. The target decode-phase process generally entails reading a decode-phase instruction from target phase behavior FIFO 326b and conforming the decode phase of the target agent to those specified in the phase behavior instructions.

Decision step 702 tests whether the instruction at the top of FIFO 326a is a target decode-phase instruction. If not, at step 704, a default decode-phase behavior instruction is obtained from the default phase configuration space 324. If the instruction is a target decode-phase instruction, at step 706 the instruction is popped from FIFO 326b. As indicated by step 708, the decode-phase information is obtained from the data-phase instruction.

Step 710 initializes the cycle count, wherein the cycle count is associated with bus 104. The bus cycle count is used in combination with the parameters specified in the target decode-phase instruction to assert and deassert selected signals at selected times.

Decision step 712 tests whether the data phase is complete. As set forth above in the master data-phase process, the data phase may be terminated by the target agent with a disconnect signal. If the data phase has ended, control is returned to step 576 of the transaction handling process of FIG. 12.

If the data phase has not ended, processing continues at step 714, where the bus cycle count is compared with the parameters specified in the target decode-phase instruction, and selected signals are asserted or deasserted as specified by the parameters.

If the command in progress is a write command, decision step 716 directs control to step 718 where a parity error signal may be asserted. A parity error signal is asserted if an actual parity error was detected or if the phase behavior instruction indicates that a parity error signal should be asserted.

It will be appreciated that, although data parity is used as an example method of error checking, decision step 716 (and other steps herein that mention parity) may be used for other forms of error checking.

Processing continues at step 720 where if a read command is in progress, control is directed to step 722, and the selected data is driven on bus 104 at the time specified by the decode-phase instruction (see "ad_event" parameter).

Decision step 724 tests whether both the master and the target agents are ready for the data transfer. If not, as indicated by step 726, the target agent waits for the master to indicate readiness. In the example embodiment, the target waits for up to 8 additional bus clock cycles for the master. While not shown, it will be appreciated that if the master agent does not become ready within this time period, the target agent will abort processing the transaction and return control to the transaction handling process step 576 of FIG. 12.

When both the master and target agents are ready, decision step 728 tests whether a write command is in process, and if a write command is detected, transfers control to step 730. At step 730, the target agent reads the data from the bus and stores the data in the selected data space of the target. Control is then returned to step 576 of the transaction handling process of FIG. 12.

The process for a target data-phase instruction is similar to the target decode-phase process. A flowchart of the target data-phase process can be constructed from the flowchart of the target decode-phase process by replacing references to the target decode-phase with references to the target data-phase. For brevity, the target data-phase process is not illustrated with a flowchart.

Accordingly, the present invention provides, among other aspects, a method and system for simulating a communications bus. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for simulating operation of a system that includes a communications bus, comprising:

instantiating a plurality of bus agents coupled to the bus, wherein the bus agents include a behavioral agent and an application agent;

loading a first bus command into memory space of a selected one of the bus agents, the first bus command indicating a bus operation to be performed and involving one or more data phases;

loading phase behavior instructions into memory space of the behavioral agent, at least one of the phase behavior instructions specifying a data phase duration relative to the first bus command;

processing the first bus command; and conforming the data phases during the first bus command to the phase behavior instructions.

2. The method of claim 1, wherein at least one of the phase behavior instructions specifies generation of error checking information.

3. The method of claim 1, wherein at least one of the phase behavior instructions specifies selection of one of two or more possible bus sizes.

4. The method of claim 1, further comprising:

counting bus cycles as the first bus command is processed;

asserting and deasserting selected bus signals in response to comparisons of counts of the bus cycles to parameters in the phase behavior instructions.

5. The method of claim 4, further comprising driving data and address signals at selected times in response to comparisons of counts of the bus cycles to parameters in the phase behavior instructions.

6. The method of claim 1, wherein the bus command is a read command.

7. The method of claim 6, wherein the selected one of the bus agents is the behavioral agent.

8. The method of claim 6, wherein the selected one of the agents is the application agent.

9. The method of claim 1, wherein the bus command is a write command.

10. The method of claim 9, wherein the selected one of the bus agents is the behavioral agent.

11. The method of claim 9, wherein the selected one of the agents is the application agent.

12. The method of claim 1, wherein each phase behavior instruction indicates a selected number of wait states.

13. The method of claim 1, further comprising:

selecting one of the bus agents as a bus command initiator;

loading a second bus command into the memory space of the initiator;

processing the second bus command;

conforming data phases associated with the second bus command to default phase behavior instructions.

14. A method for simulating operation of a system that includes a communications bus, comprising:

instantiating a behavioral agent and an application agent coupled to the bus;

loading master phase behavior instructions into memory space of the behavioral agent, the master phase behavior instructions including a starting address instruction, an address phase instruction, and one or more data phase instructions, wherein the starting address instruction indicates an address at which to begin the bus command, the address phase instruction indicates the bus operation to be performed, and the data phase instructions specify selected signal sequences of the behavioral agent during the respective data phases; and processing the bus command by the behavioral agent; and conforming the data phases of the behavioral agent during the bus command to the phase behavior instructions.

15. A method for simulating operation of a system that includes a communications bus, comprising:

instantiating a behavioral agent and an application agent coupled to the bus;

loading target phase behavior instructions into memory space of the behavioral agent, the target phase behavior instructions including one or more data phase instructions, wherein the data phase instructions specify selected signal sequences of the behavioral agent during the respective data phases;

loading a bus command into memory space of the application agent; and processing the bus command by the application agent; and conforming the data phases of the behavioral agent during the bus command to the phase behavior instructions.

16. An arrangement for simulating operation of an electronic system including a communications bus, comprising:

a simulator;

a bus;

a behavioral agent coupled to the bus and hosted by the simulator;

an application agent coupled to the bus and hosted by the simulator;

a simulation control bus coupled to the behavioral agent and to the application agent and hosted by the simulator; and a simulation controller coupled to the simulation control bus and hosted by the simulator, wherein the simulation controller is configured and arranged to selectively provide bus commands to the behavioral agent and to the application agent, each bus command indicating a bus operation to be performed and involving one or more data phases, and selectively providing phase behavior instructions to the behavioral agent, the phase behavior instructions respectively specifying data phase durations relative to the bus commands.

17. The arrangement of claim 16, wherein the behavioral agent includes a phase behavior instruction queue that is writable by the simulation controller.

18. The arrangement of claim 17, wherein the behavioral agent further includes default phase configuration address space that is writable by the simulation controller.

19. An apparatus for simulation of an electronic system that includes a communications bus, comprising:

means for configuring a master agent with a bus command, the bus command indicating a bus operation to be performed involving one or more data phases;

means for configuring a behavioral agent with one or more phase behavior instructions, at least one of the phase behavior instructions specifying a data phase duration relative to the first bus command;

means for initiating processing of the bus command by the master agent; and means for selectively driving selected bus signals in response to parameters in the phase behavior instructions.

* * * * *